United States Patent [19]

Nishiura

[11] Patent Number: 4,553,100

[45] Date of Patent: Nov. 12, 1985

[54] COUNTER-ADDRESS MEMORY FOR MULTI-CHANNEL TIMING SIGNALS

[75] Inventor: Junji Nishiura, Gyoda, Japan

[73] Assignee: Takeda Riken Co., Ltd., Gyoda, Japan

[21] Appl. No.: 501,864

[22] Filed: Jun. 7, 1983

[30] Foreign Application Priority Data

Jun. 7, 1982 [JP] Japan ............................. 57-97415

[51] Int. Cl.⁴ ........................................... H03L 7/24
[52] U.S. Cl. .................................... 328/63; 307/269; 307/597; 307/602; 328/62; 328/72; 377/51; 377/114
[58] Field of Search ............... 307/269, 595, 597, 602, 307/603, 606; 328/60–63, 72; 377/19, 26, 47, 52, 56, 106, 114; 364/900 MS File

[56] References Cited

U.S. PATENT DOCUMENTS

| | | | |
|---|---|---|---|
| 3,508,207 | 4/1970 | Shigaki | 364/900 MS |
| 4,122,309 | 10/1978 | Jacobsen | 328/60 X |
| 4,291,241 | 9/1981 | Mayama et al. | 307/269 |
| 4,385,395 | 5/1983 | Tanaka et al. | 328/63 X |
| 4,413,350 | 11/1983 | Bond et al. | 377/114 X |
| 4,415,861 | 11/1983 | Palmquist et al. | 328/61 X |
| 4,431,926 | 2/1984 | Mayumi | 377/114 X |
| 4,468,624 | 8/1984 | Rehbein et al. | 328/61 X |

FOREIGN PATENT DOCUMENTS 2450006 10/1980 France ............................. 328/60

Primary Examiner—Stanley D. Miller
Assistant Examiner—D. R. Hudspeth
Attorney, Agent, or Firm—Staas & halsey

[57] ABSTRACT

A counter counts clock signals following a reference signal to provide an address for accessing a memory wherein marks are stored at respective addresses corresponding to desired timing signals with respect to the reference signal. The memory has plural channels, all of which are accessed by the same count value, to provide different timing signals on different channel outputs corresponding to the marks stored in respective portions of the memory. Different sets of timing signals can be stored in different memory blocks, and the memory block which is accessed by the count value can be selected. The memory can be divided into plural memories of smaller capacity, and low speed memories can be used. A timing signal with respect to a first reference signal can be provided after the occurrence of the subsequent reference signal. The marks that are stored in the memory can be quickly erased and the next set of marks put into the memory, including offset data for compensated timing signals for rapid testing of devices.

22 Claims, 24 Drawing Figures

COUNTER-ADDRESS MEMORY FOR MULTI-CHANNEL TIMING SIGNALS

BACKGROUND OF THE INVENTION

This invention relates to a timing signal generating apparatus which generates timing signals of various timing for many channels for testing semiconductor integrated circuits.

In testing a semiconductor integrated circuit, timing signals of variable delay times are required.

In a conventional timing signal generator of this kind each channel has a counter which is reset by a reference signal, and after being reset each counter starts counting clock signals which are commonly provided to all of the counters. Registers are also provided for storing the data corresponding to the periods from the reference signal to each of the various timing signals to be generated for all the channels. The counted data of each counter is compared by a comparator provided for each channel with the data stored in the register and when both data coincide with each other, a timing signal is generated at the output of the comparator.

In this conventional timing signal generator, since a counter, a register, and a comparator are required for each channel, the total number of components required increases as the number of channels increases, and thus it becomes high in cost and large in size.

SUMMARY OF THE INVENTION

It is an object of the present invention to provide a timing signal generator which is capable of generating required timing signals for many channels by a simple construction.

According to this invention a mark memory is provided which stores a mark 1 in an address corresponding to a time interval from a reference signal to the timing signal that is desired to be generated. First a counter is preset, for example to 0, by the reference signal and then the counter counts clock signals provided thereto for a fixed time after the reference signal. The mark memory is accessed in succession by the counted data from the counter so that the mark is read out from the specified address of the mark memory and the mark that is read out is used for generating a timing signal for each channel.

Accordingly, by changing addresses wherein marks are stored, it is possible to change timings of the timing signals to be generated with respect to the reference signal with ease. Since registers or comparators are not required in this invention, a timing signal generator can be provided with fewer components that in the prior art.

DETAILED DESCRIPTION OF THE PREFERRED EMBODIMENTS

Timing signal generators in accordance with the present invention are now described with reference to the drawings.

Figure 1:
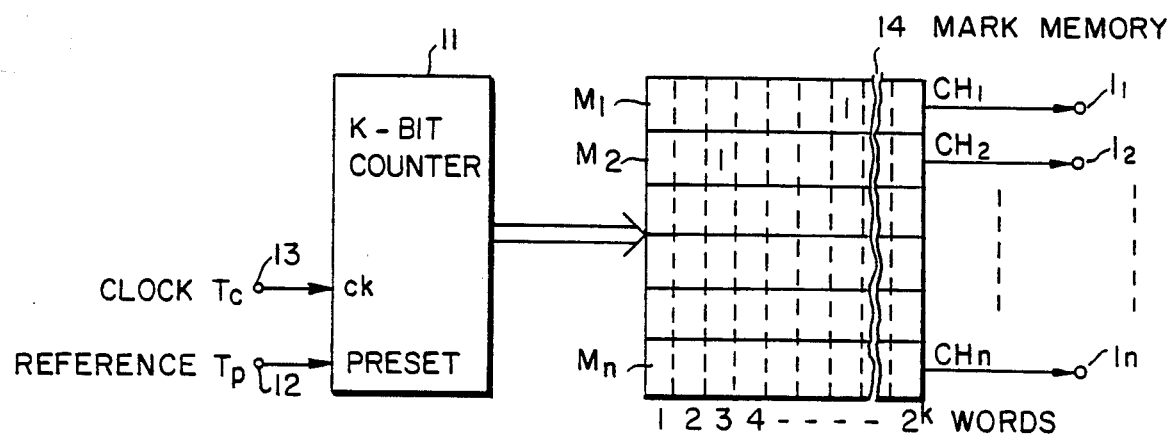
FIG. 1 is a circuit diagram showing an embodiment of a timing signal generating apparatus in accordance with the present invention.
Figure 2:
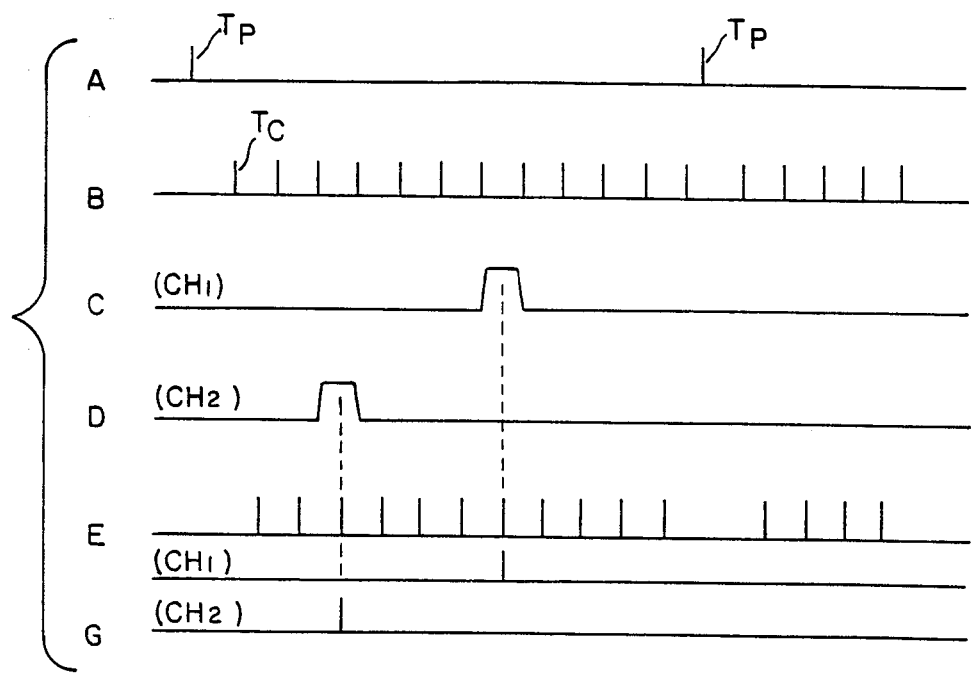
FIGS. 2A to 2G are timing charts for explaining the operation of the embodiment of FIG. 1.

FIG. 1 shows a basic concept of the timing signal generating apparatus in accordance with the present invention. A k-bit counter 11 is preset by a reference signal Tp provided from a terminal 12 and starts counting the subsequent clock signal Tc provided from a terminal 13. A mark memory 14 is accessed by the counted data of the counter 11. The mark memory 14 has $2^k$ storage locations and a word of each storage location has n bits, where n is the number of channels required in a timing signal generating apparatus. In other words, the mark memory 14 is comprised of n memories $M_1$ to $M_n$ which correspond to channels CH1 to CHn, respectively. Each time an address is accessed by the address data provided from the counter 11, an n-bit word specified by the address data is read out at output terminals $1_1$ to $1_n$ of the mark memory 14. In other words, for each channel CH1 to CHn, the mark memory 14 has $2^k$ addresses with a 1-bit data in each address.

These mark memories $M_1$ to $M_n$ are commonly accessed by the data provided from the counter 11. A mark 1 is selectively stored in the addresses of mark memories $M_1$ to $M_n$ corresponding to the timing to be generated for each channel. The counter 11 is incremented by the clock signal Tc from the terminal 13 which is generated a fixed time after the occurrence of the reference signal Tp as illustrated in FIGS. 2A to 2G.

In the case that the timing signal in the channel CH1 is desired to be generated, for instance, 112 nano-seconds after the reference signal Tp, and the time period of the clock signal Tc is, for example, 16 nano-seconds, a mark 1 is stored in the address 7 of the mark memory M1. Thus, when the counted result becomes 7, the address data which represents the 7th storage location is provided to the mark memory 14 and thus the mark is read out as shown in FIG. 2C and outputted at the output terminal $1_1$ as a timing signal. Concerning the second channel CH2, a mark 1 is stored in the address 3 of the mark memory $M_2$, so that, as illustrated in FIG. 2D, a timing signal is generated at a time when the third clock signal Tc is counted by the counter 11. Namely, in the second channel, the timing signal is obtained 48 nano-seconds later than the reference signal Tp.

As described above, in this embodiment the timing signals for n channels can be generated by using the counter 11 and the mark memory 14, and the construction of the timing signal generating apparatus is greatly simplified. For changing the timing of a timing signal, it is sufficient to change an address of the mark memory 14 wherein a mark is stored.

Figure 3:
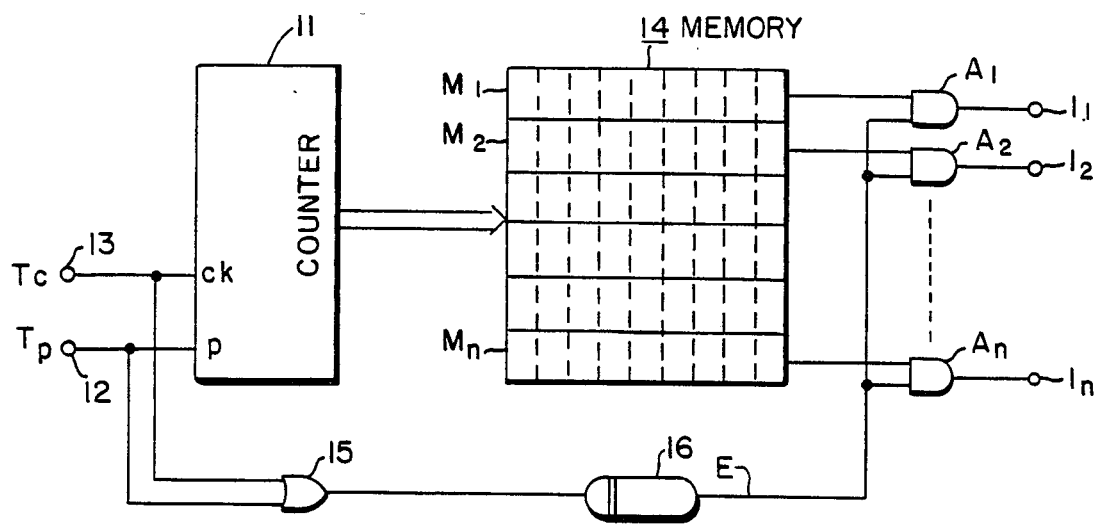
FIG. 3 is a circuit diagram of a modification of the embodiment of FIG. 1, for eliminating the uncertainty caused by the access time of a mark memory.

In accessing a memory, an access time, that is, the time that is required for obtaining an output signal from a memory after an address of the memory is specified by the address data, varies according to the characteristics of each storage location in the memory. Thus, timing signals generated from the mark memory have slight variations in time according to the access time of the storage locations. FIG. 3 shows a circuit diagram of an embodiment in accordance with the present invention for eliminating the uncertainty caused by the difference of access time of storage locations of the mark memory. In FIG. 3 AND gates $A_1$ to $A_n$ are provided at the outputs of mark memories $M_1$ to $M_n$. Either the clock signal or the reference signal is provided to the AND gates $A_1$ to $A_n$ through an OR gate 15 and a delay circuit 16. The delay time of the delay circuit 16 is selected for opening the AND gates $A_1$ to $A_n$ after the signal from the storage location with the longest access time is provided thereto. Accordingly, timing signals are generated as shown in FIGS. 2F and G in synchronism with the delayed clock signals shown in FIG. 2E without being affected by differences in the access times.

Figure 4:
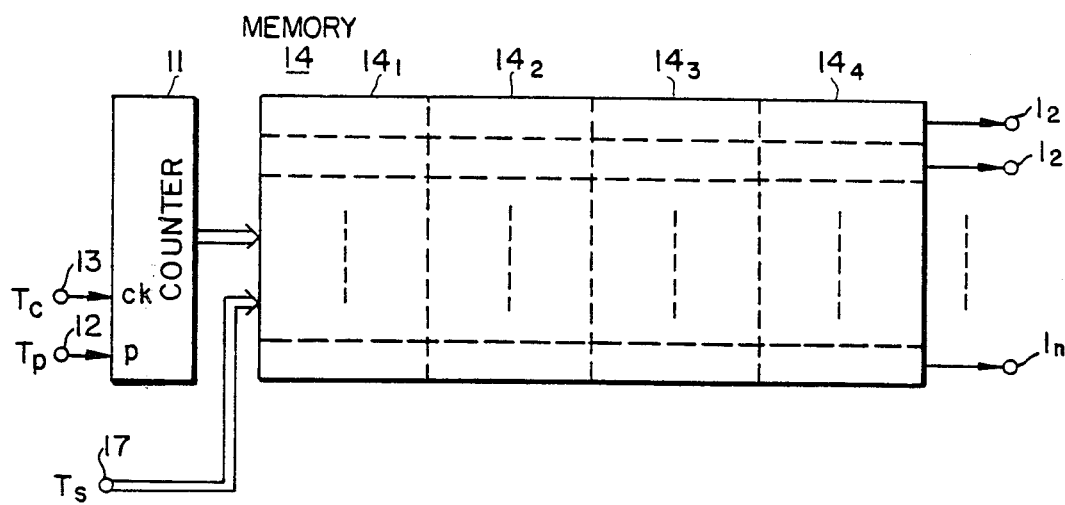
FIG. 4 is a circuit diagram of an embodiment of a timing signal generating apparatus for generating timing signals of different timings for a channel in accordance with the present invention.

In semiconductor integrated circuit testing, it is often desired to generate in a channel a plurality of timing signals each of which has a different delay time with respect to a reference signal. In this case, timing set data Ts as shown in FIG. 4 is provided to the mark memory 14 from a terminal 17. The mark memory 14 is comprised of a plurality of memory blocks $14_1$ to $14_4$ each of which has the same memory construction as FIG. 3, for example, and each of which is addressed commonly by the counted data from the counter 11. Further, the upper bits of the address can be considered to be supplied by the timing set data Ts to select one of the memory blocks $14_1$ to $14_4$. In each memory block $14_1$ to $14_4$, marks are stored in the addresses correponding to the delay times for generating desired timing signals. Thus it is possible to change the timing of the timing signal in one channel in real time by changing the timing set data $T_s$ for every occurrence of the reference signal.

Figure 5:
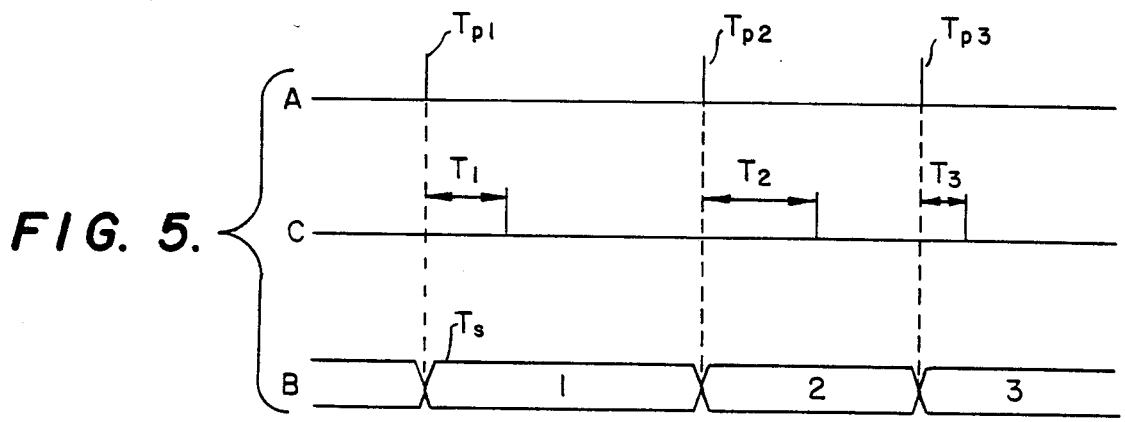
FIGS. 5A to 5C are timing charts for explaining the operation of the circuit of FIG. 4.

The operation of the embodiment of FIG. 4 is further explained in reference to FIGS. 5A to 5C. Each reference signal Tp1, Tp2 and Tp3 is provided as illustrated in FIG. 5A and timing set data 1, 2 and 3 is provided, respectively, for each reference signal for sequentially selecting the memory blocks $14_1$, $14_2$ and $14_3$ as indicated by FIG. 5B. Regarding the first reference signal Tp1, the memory block $14_1$ is selected because the timing set data indicates 1, and a timing signal is generated at the output terminal which is delayed by the time period $T_1$ from tne reference signal Tp1 as illustrated in FIG. 5C. Similarly, for the second reference signal Tp2, the memory block $14_2$ is selected by the timing set data 2 resulting in a timing signal being generated at the time $T_2$ after the occurrence of the reference signal Tp2. Regarding the next reference signal Tp3, the memory block $14_3$ is selected by the timing set data to generate a timing signal at time $T_3$ after the reference signal Tp3.

As has been described, different timing signals are thusly generated for the same channel. Although the timing set data Ts is supplied to the mark memory 14 as the upper bits of the address in this example, it is possible to supply the timing set data as the lower bits of the address.

In the embodiment described above, as the number of time steps is increased or as a longer delay time is required for generating the timing signals, the required capacity of the mark memory becomes quite large. For instance, if a timing signal delayed by 1.048576 milli-seconds is desired to be generated, then 65,536 storage locations are required in the mark memory when the period of the clock signal is 16 nano-seconds. Further, a high speed memory of about 10 nano-seconds access time is necessary for being operated by such a 16 nano-second clock signal. However, a memory with both high speed and large capacity is quite expensive.

Figure 6:
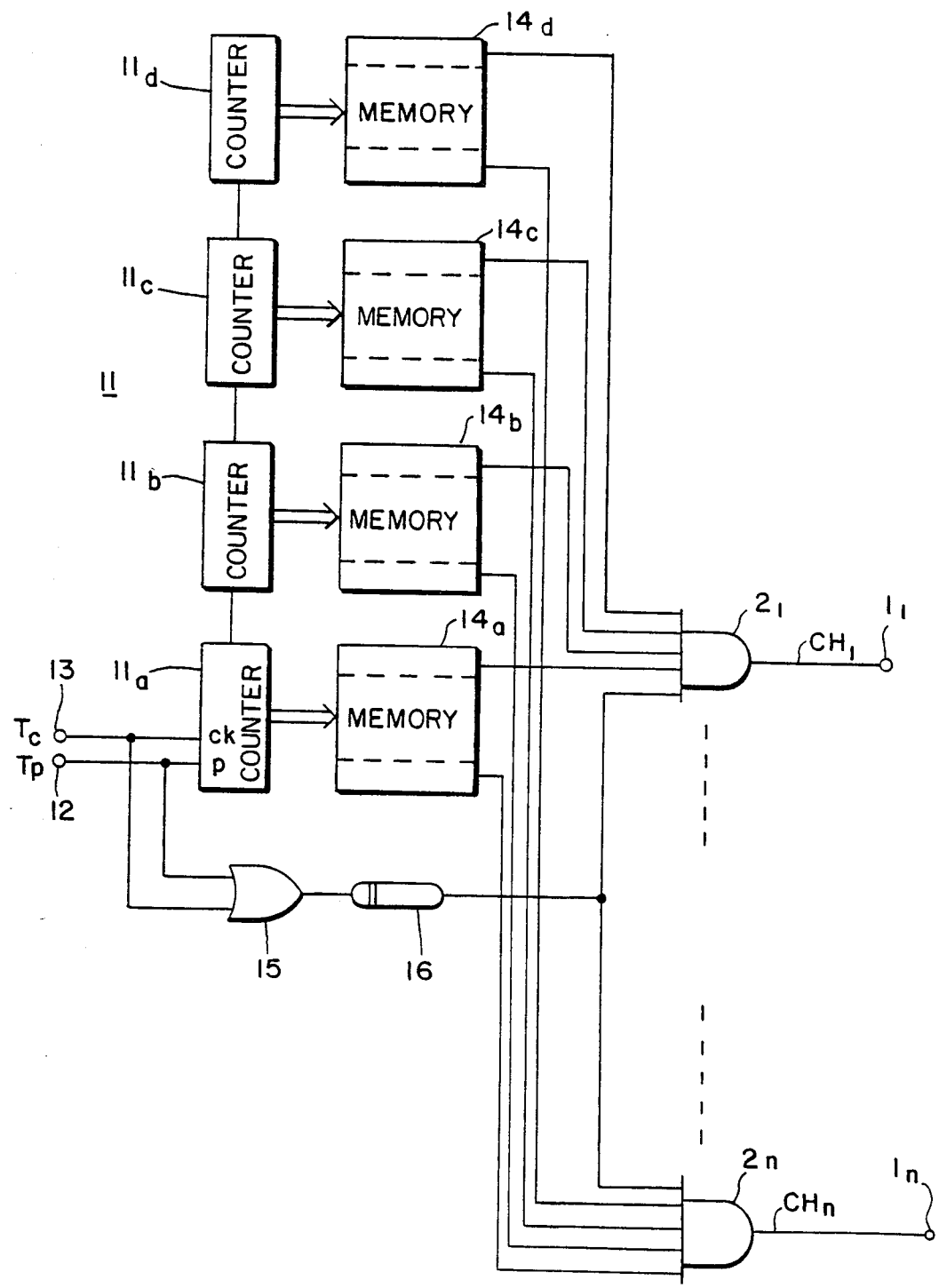
FIG. 6 is a circuit diagram showing a timing signal generating apparatus for reducing the capacity of a mark memory of the present invention.

An embodiment for reducing the required capacity of the mark memory in such cases, by dividing up the mark memory, is illustrated in FIG. 6. In FIG. 6 the counter 11 is divided into four counters 11a to 11d each of which has a plurality of bits. Mark memories 14a to 14d are also provided corresponding to the counters 11a–11d, respectively. Each mark memory 14a to 14d has n-bit words for n channels in the same way as the embodiments described above, but the total number of addresses are reduced since the addresses provided from the counters 11a to 11d are divided. The data that is read out from corresponding channels of the mark memories 14a to 14d are respectively supplied to AND gates $2_1$ to $2_n$ whose outputs are connected to the output terminals $1_1$ to $1_n$ respectively.

Consider that the period of the clock signal Tc is 16 nano-seconds and that the maximum delay time required is 1.048576 milli-seconds, so that the counter 11 of FIG. 4 would need 16 bits for addressing the mark memory. In FIG. 6 the counter 11 is divided into four counters connected in series, each of which has 4 bits, for example. Since the counters 11a to 11d are 4-bit counters, the counter 11a counts up to 256 nano-seconds, the next counter 11b counts up to 4,096 nano-seconds, and the counter 11d counts up to 1.048576 milli-seconds. For the case of generating a timing signal delayed 1 millisecond with respect to the reference signal for the channel CH1, the output data of the counter 11 should be 1111010000010100. Since the counter 11 is divided into four counters in this embodiment, the output of the counter 11a should be 0100, and thus the corresponding mark memory 14a has a mark 1 in the fourth storage location of the channel CH1. A mark 1 is written into the first storage location of the channel CH1 of the mark memory 14b since the 4-bit data from the counter 11b is 0001. Similarly, the mark memory 14c stores the mark 1 in the address 4 of the channel CH1 because the 4-bit data from the counter 11c is 0100, and the channel CH1 of the mark memory 14d stores the mark in the address 15 since the data from the last counter 11d is 1111. Thus when the counted data of the counter 11 becomes 1111010000010100 as a result of counting the clock signals after being preset by the reference signal, the signals that are read out from all the channels CH1 of the mark memories 14a-14d all become 1, so that the output signal delayed by 1 milli-second with respect to the reference signal is generated at the AND gate $2_1$.

Figure 7:
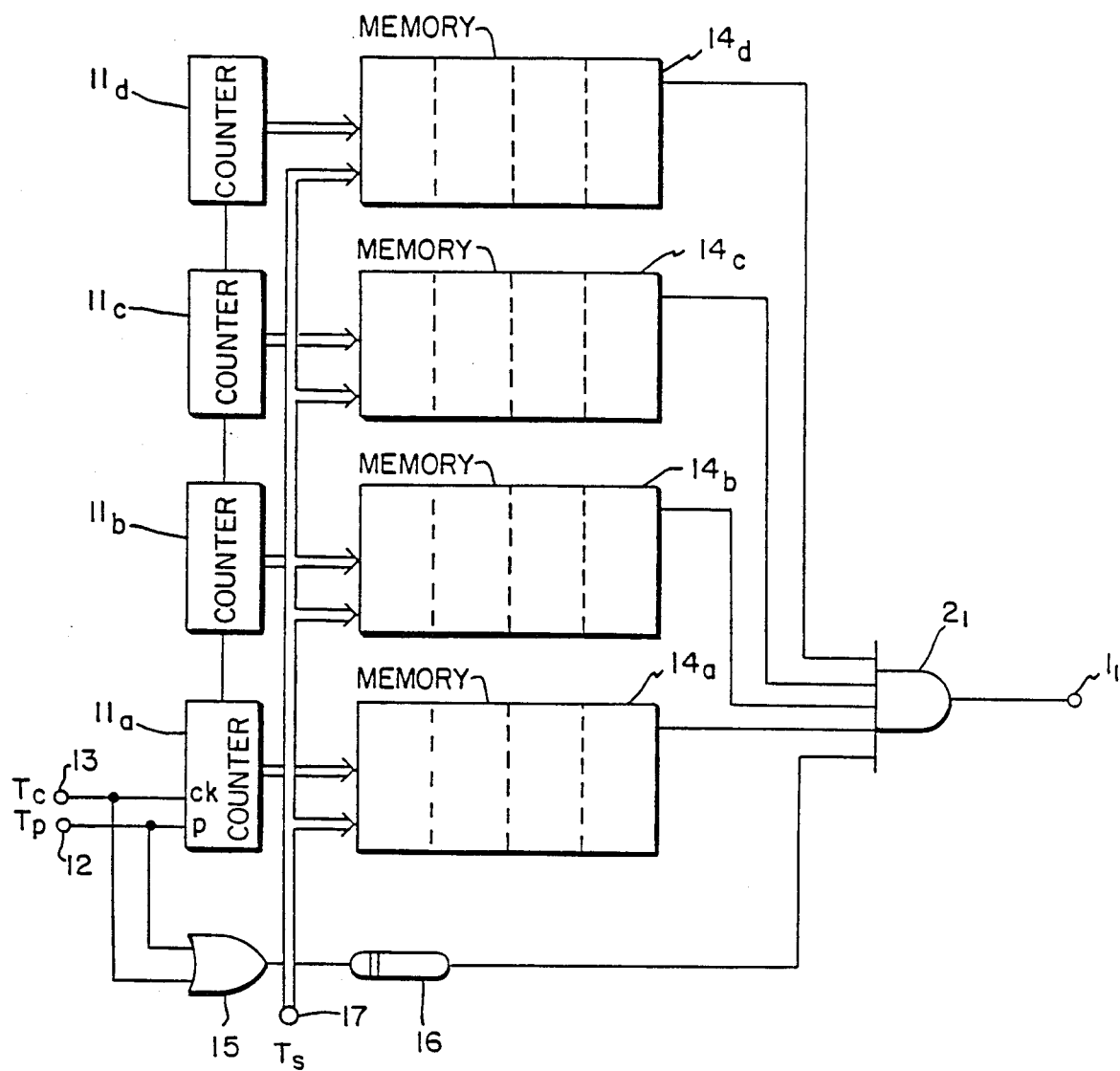
FIG. 7 is a circuit diagram of a timing signal generating apparatus which results from combining the apparatus of FIG. 6 with that of FIG. 4.

In the embodiment shown in FIG. 1, the mark memory 14 needs storage locations for generating a 1 millisecond timing signal, whereas in the embodiment of FIG. 6, the mark memory 14 needs 64 storage locations. Generally, a high speed memory of about 10 nano-seconds access time is not so expensive if its capacity is small such as 256 bits. It is especially effective to apply this invention to the embodiment of FIG. 4, since the capacity of the mark memory is thusly further increased for being able to select the memory blocks by the timing set data Ts. FIG. 7 shows one of the examples wherein the embodiments of FIGS. 4 and 6 are combined.

Figure 8:
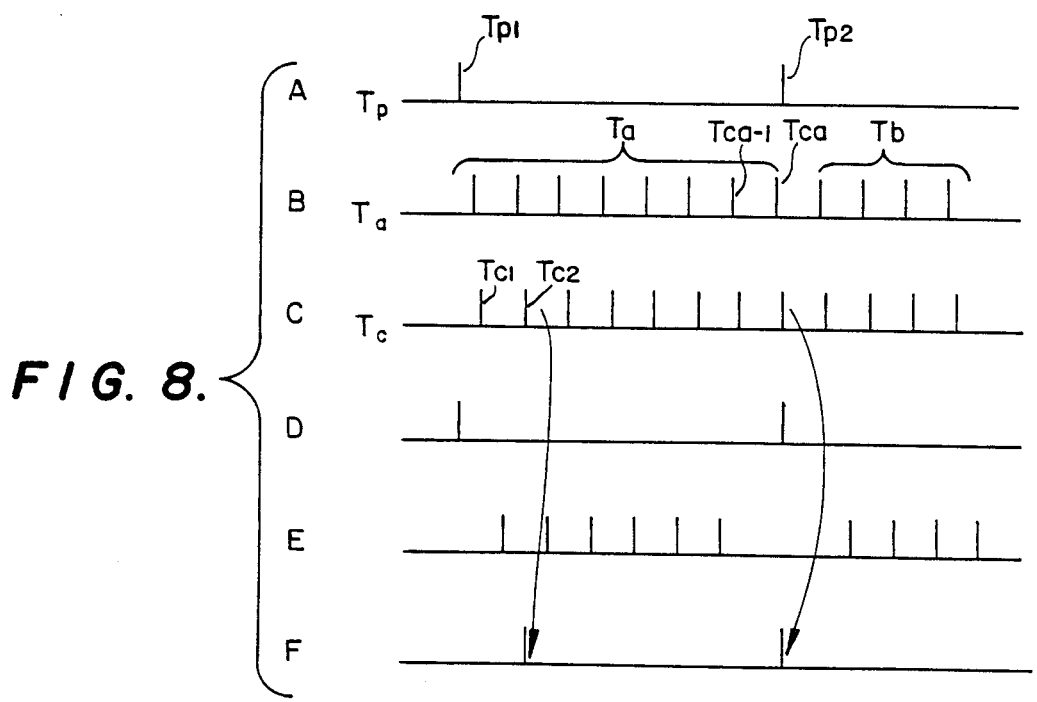
FIGS. 8A to 8F are timing charts for explaining the uncertainty of operation that occurs when the clock signal and the reference signal are closely spaced to each other.

In generating timing signals delayed by specified numbers of the clock period from the reference signal, it may happen that the last clock signal and the next reference signal are closely spaced with each other, which can cause an erroneous counting of the clock signal. For example, consider the case as illustrated in FIGS. 8A to 8F. In FIG. 8A, the first reference signal Tp1 and the next reference signal Tp2 are illustrated. In FIG. 8B, a group of clock signals Ta following the first reference signal Tp1, and a group of clock signals Tb following the second reference signal Tp2, are closely spaced with each other with respect to time. Thus there is the possibility that, before the desired output of the data from the mark memory accessed by the address data according to the clock count Tca can occur, the counter might be preset by the reference signal Tp2, thus resulting in the address data being preset and thereby preventing the required timing signal from being obtained from the mark memory.

Further, in the testing of semiconductor integrated circuits, a timing signal generator with high resolution, for example of around 100 pico-seconds, is required. In this case, since the mark memory is not operable at such a high speed, variable delay circuits (not illustrated) are provided in series with the output terminals $1_1$ to $1_n$ for obtaining time differences of 100 pico-seconds.

Figure 9:
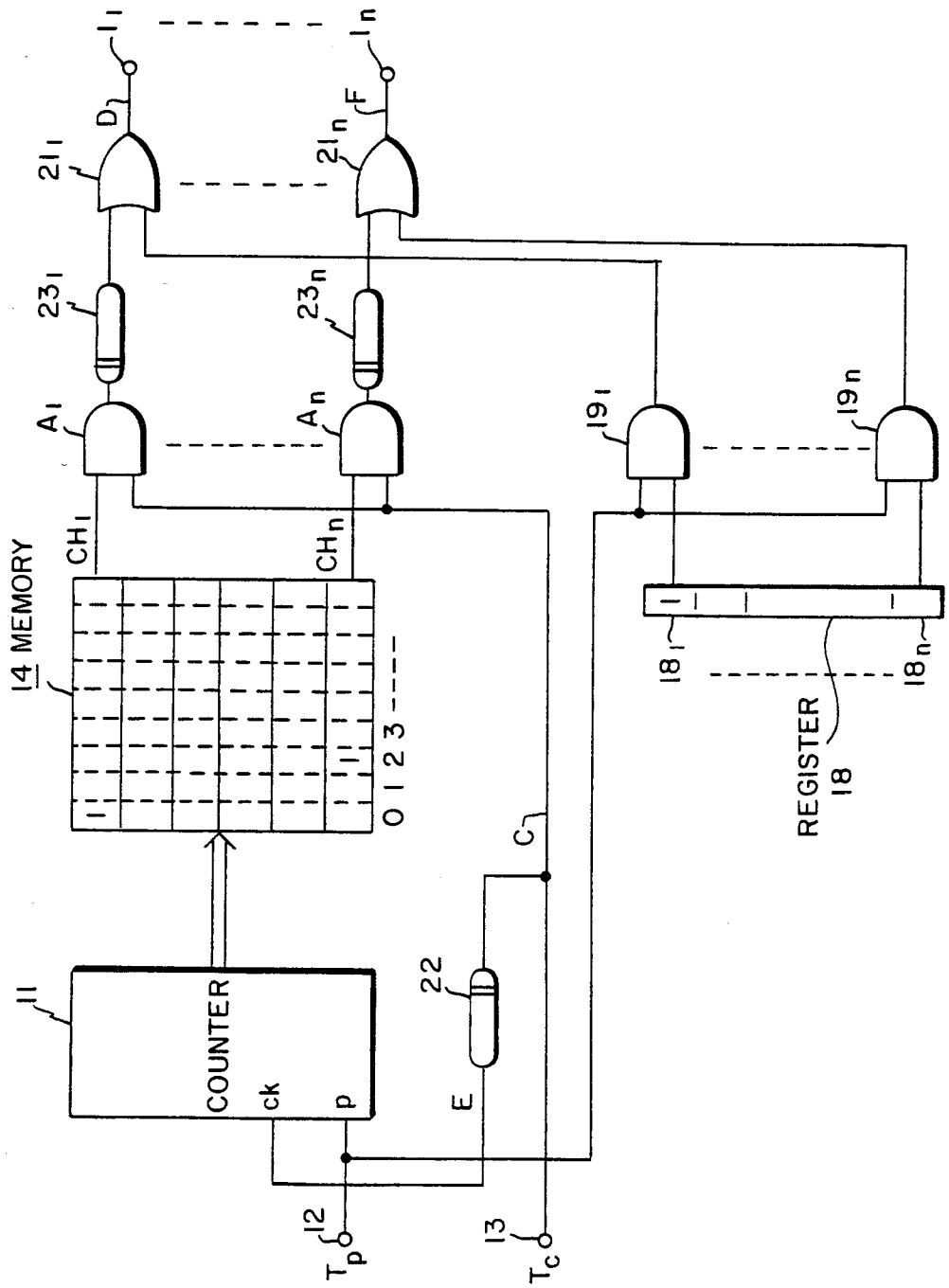
FIG. 9 is a circuit diagram showing a timing signal generating apparatus of the present invention for eliminating the uncertainty of the operation explained in reference to FIG. 8.

For avoiding improper operation caused by the coincidence of the clock signal and the next reference signal as described above, and also for generating timing signals of high resolution, the circuit diagram of in FIG. 9 illustrates a preferred embodiment of the present invention.

In FIG. 9, a register 18 is provided which indicates whether or not a timing signal with a small delay, that is, of less than a clock period, is to be generated. When a timing signal of less than a clock period delay from the reference signal is desired to be generated, data 1 is stored in the respective bit of register 18 for each channel. The data from the register 18 and the reference signal from the terminal 12 are supplied to AND gates $19_1$ to $19_n$. The outputs of the AND gates $19_1$ to $19_n$ are provided to the output terminals $1_1$ to $1_n$ via OR gates $21_1$ to $21_n$, respectively. The clock signal from the terminal 13 is provided to the counter 11 through a delay circuit 22. Further, the counter 11 is preset by the reference signal to 1 in this embodiment. Each output from the channels $CH_1$ to $CH_n$ of the mark memory 14 is supplied to the OR gates $21_1$ to $21_n$ via AND gates A1 to An and via delay circuits $23_1$ to $23_n$.

To generate a timing signal for a time interval which starts at the reference signal Tp1 and which is less than the period of the clock signal Tc in FIG. 9 for the channel CH1, the data 1 is stored in the first bit $18_1$ of the register 18. Before providing the clock signal to the counter 11, a signal D is generated at the output terminal as in FIG. 8D, through the AND gate $19_1$ in synchronism with the reference signal Tp1, since the data from the register address $18_1$ is 1 so that the AND gate $19_1$ is open. Thus by delay circuits (not shown) which have time differences of 1200 pico-seconds, for instance, connected in series with the output terminal $1_1$, a timing signal which has a required delay time within one clock period and a high resolution is obtained.

In the case of a clock pulse occurring very close to the next reference signal Tp2, as mentioned above, the embodiment of FIG. 9 works as follows. Since the counter 11 is preset to 1 by the first reference signal Tp1, the counter becomes 2 by the first clock pulse Tc1 of FIG. 8C and becomes 3 by the second clock pulse Tc2 and so on. Namely, the addresses 1, 2 and 3 of the mark memory are accessed before generation of the clock pulses Tc1, Tc2 and Tc3, respectively. In other words, in this embodiment, the addresses of the mark memory 14 are accessed one clock pulse prior to that of the embodiments of FIGS. 2, 3, 6 and 7. Thus in the case where a mark 1 is stored in the address 2 of the n-th channel CHn of the mark memory 14 as in FIG. 9, the mark 1 in the address 2 is read out by the first clock pulse Tc1 of FIG. 8E, so that a timing signal is generated at the output terminal $1_n$ as shown in FIG. 8F in synchronism with the next clock signal Tc2.

Accordingly, even though the last clock signal Tca is closely spaced to the next reference signal Tp2 as shown in FIGS. 8A and 8B, the data corresponding to the clock signal Tca is already read out from the mark memory 14 by the clock signal Tca-1, and a timing signal as shown in FIG. 8F is generated at the output terminal in synchronism with the next clock signal Tca. Thus although the counter 11 may be preset by the reference signal Tp2, the timing signal required is already outputted and thus there arises no improper operation as mentioned above.

The delay circuit 22 is inserted for preventing the output signal from being generated at the output terminal in synchronism with the clock signal being applied at that time to the counter, and instead the output signal is provided at the next clock signal. Thus the delay circuit 22 is not always necessary because a certain length of time has usually elapsed, from the time of providing the clock signal to the counter 11 until the data is read out from the mark memory, so that the signals at the AND gates $A_1$ to $A_n$ are generated in synchronism with the next clock signal. The delay circuits $23_1$ to $23_n$ are used for adjusting the time differences between the output signals from the AND gates $A_1$ to $A_n$ and the output signals from the AND gates $19_1$ to $19_n$, so that the timing signal generated from for example the address 1 of the mark memory 14 occurs one clock period after the signals provided from the AND gates $19_1$ to $19_n$.

Figure 10:
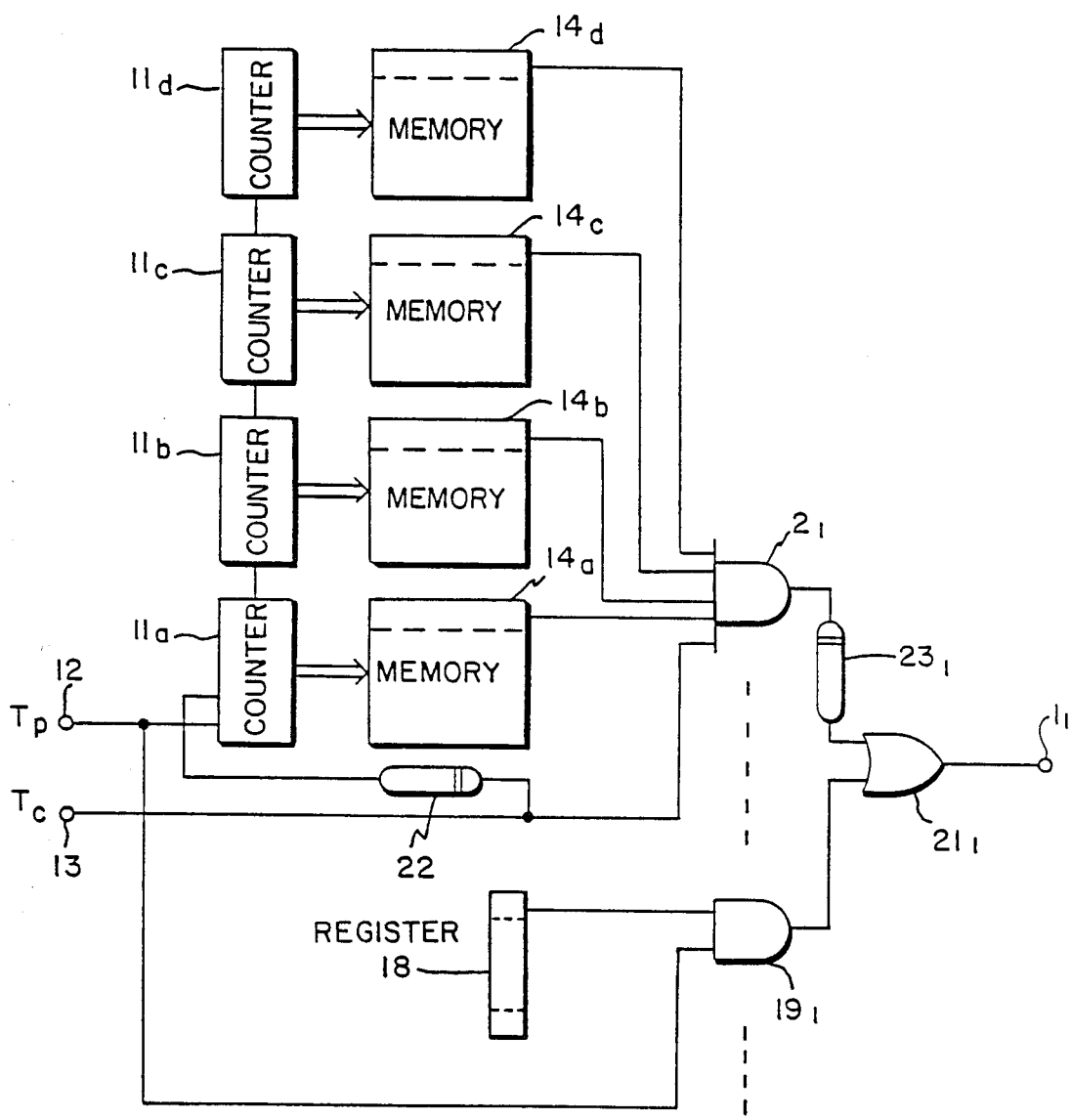
FIG. 10 is a circuit diagram for a configuration of a timing signal generating apparatus which results from applying the feature in FIG. 9 to the embodiment of FIG. 6.
Figure 11:
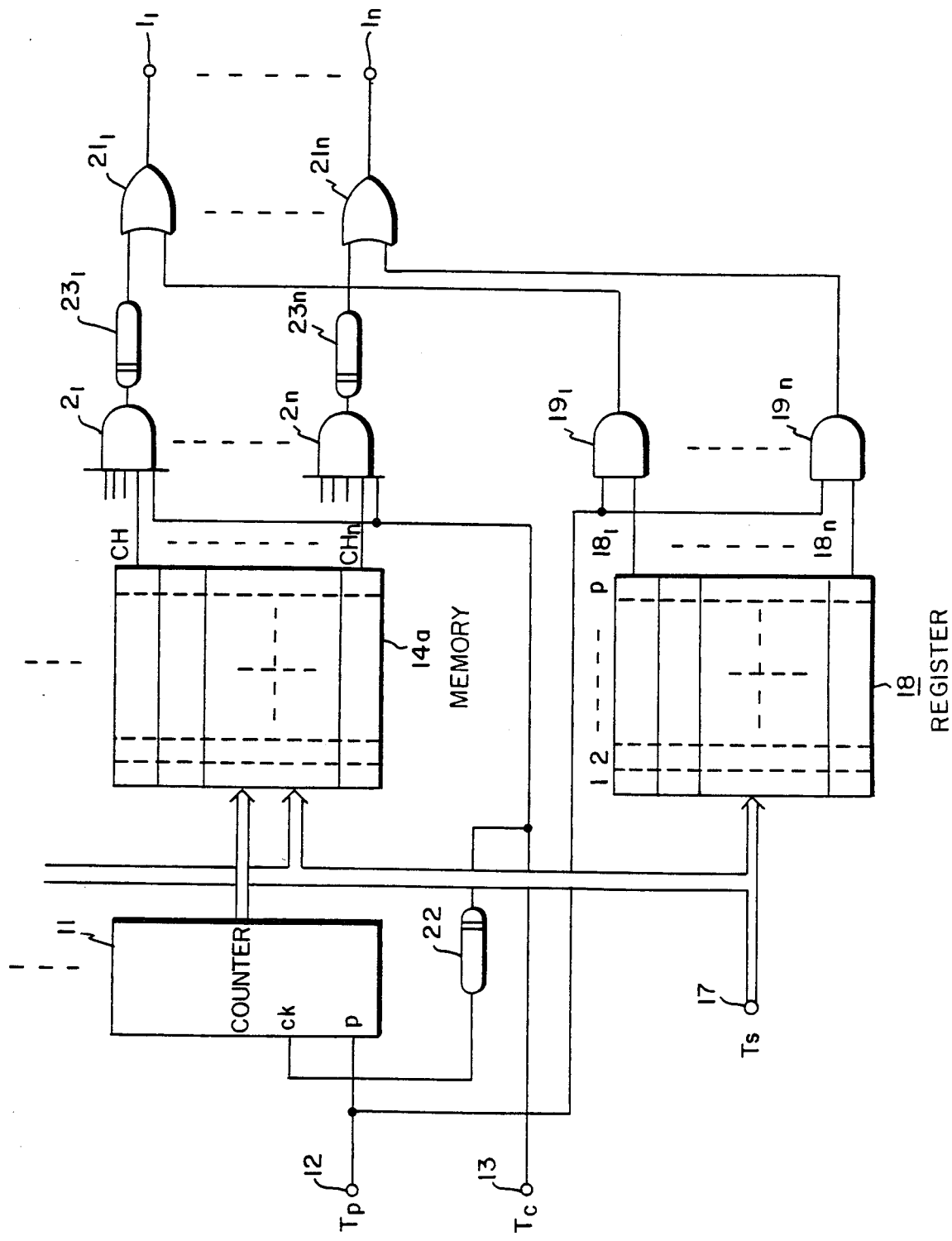
FIG. 11 is a circuit diagram of one example of construction of a timing signal generating apparatus obtained by combining the feature shown in FIG. 4 with the circuit of FIG. 10.

The circuit configuration for generating timing signals delayed for shorter periods than the clock period as mentioned above in FIG. 9 is applicable as illustrated in FIG. 10 to the embodiment of FIG. 6, wherein the counter and the mark memory are divided for reducing the memory capacity. Also, the means described in FIG. 9 can be applied to the embodiment of FIG. 7 as illustrated in FIG. 11. Corresponding parts of the figures have the same reference characters. In FIG. 11, a memory of n-bits per word is used as the register 18 of FIG. 9, and this memory is addressed by timing set data Ts provided from a terminal 17.

In the embodiments of FIGS. 6, 7, 10 and 11, respectively, the mark memories 14a to 14d have to supply signals to the AND gates $2_1$ to $2_n$ for each channel at the same time. For doing this, the mark memories 14a to 14d need to operate with the same access times. For instance, if the period of the clock signal $T_c$ is 16 nanoseconds, all the mark memories 14a to 14d must operate with about 10 nano-seconds of access time, but such high speed memories are expensive.

Figure 12:
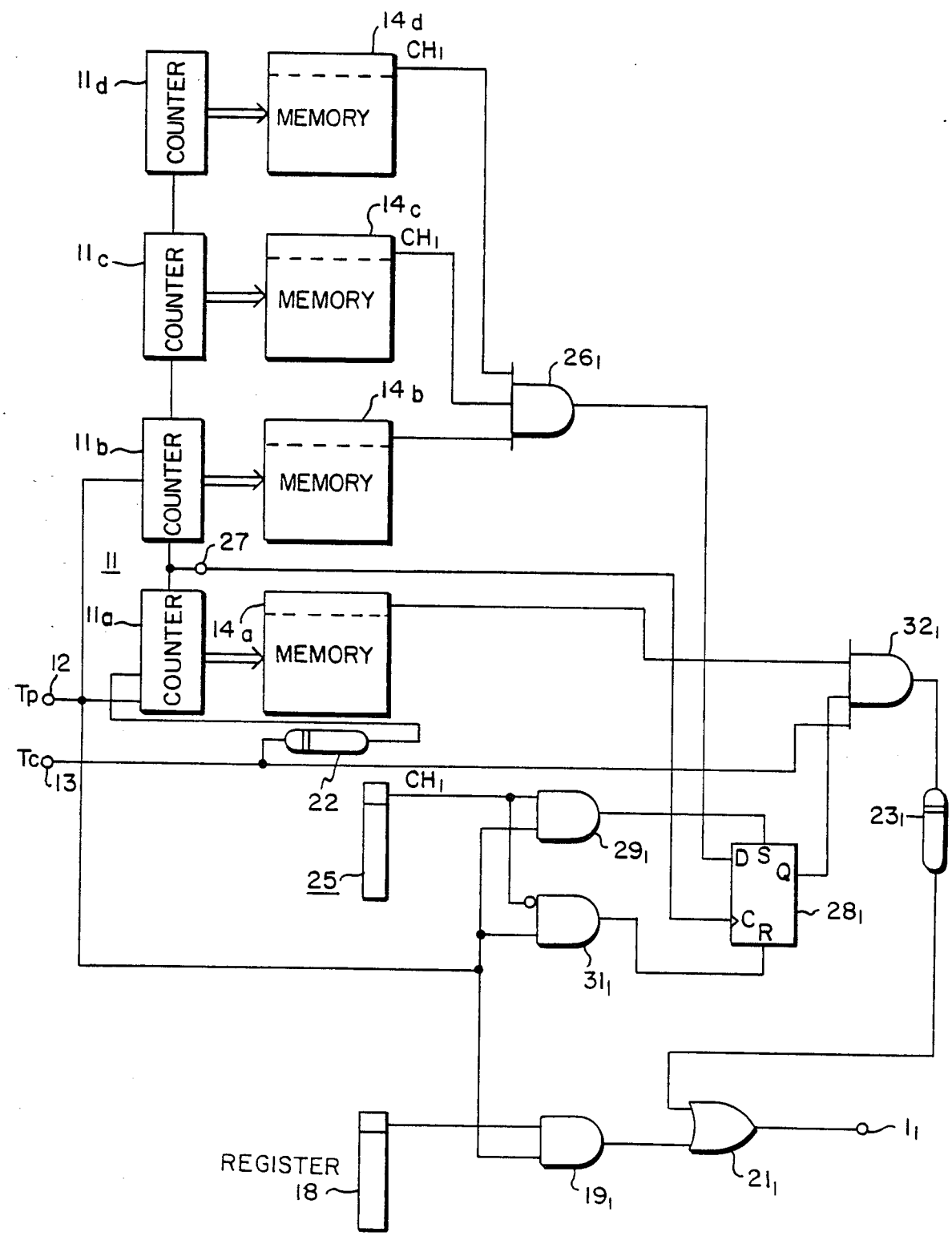
FIG. 12 is a circuit diagram of a timing signal generating apparatus of the present invention wherein a low speed memory is used as the mark memory for reducing the cost.

FIG. 12 shows an embodiment in accordance with the present invention for reducing the cost of the mark memories by using low speed memories. If the clock period is 16 nano-seconds, an address sequence to the mark memory 14b is 256 nano-seconds or more, at least 4,096 nano-seconds for the mark memory 14c and at least 65.536 micro-seconds for the mark memory 14d. Thus by applying the idea shown in FIG. 9 wherein the counter 11 is preset to 1 by the reference signal for obtaining one clock period margin, it is possible to comprise a timing signal generating apparatus with low speed memories for the mark memories 14b, 14c and 14d and with a high speed memory for the mark memory 14a.

In FIG. 12, the mark memory 14a is a high speed memory, for example, of about 10 nano-seconds access time, and the other memories 14b, 14c and 14d are low speed memories of, for example, about 200 nano-seconds access time, while the period of the carry signal from the counter 11a to the counter 11b is 256 nano-seconds in this case, since 11a is a 4-bit counter. A register 25 is provided in this embodiment, for indicating whether a timing signal is desired to be produced in each channel within the time interval of the carry signal from the counter 11a, that is, within the first 256 nanoseconds.

For generating a timing signal of shorter delay with respect to the reference signal than the time period of the carry signal, the data 1 is stored in the position corresponding to each respective channel of the register 25. When the data of the register 25 is 1, a timing signal is generated at a time when a mark 1 is read out from the high speed mark memory 14a. If the data of the register 25 is not 1, a timing signal is generated at a time when an AND signal of all the data read out from the mark memories 14b to 14d is obtained. Thus, as illustrated in FIG. 12, for the channel CH1 the outputs of the low speed memories 14b to 14d are connected to an AND gate $26_1$. The carry signal generated by the counter 11a is provided from a terminal 27 to a flip-flop $28_1$ to take an output signal from the AND gate $26_1$ into the flip-flop $28_1$. Also, AND gates $29_1$ and $31_1$ are provided for the channel CH1 for setting and resetting the flip-flop $28_1$. The data from the register 25 and the reference signal $T_p$ are provided to the AND gate $29_1$ whose output signal sets the flip-flop $28_1$. An inverted output of the register 25 and the reference timing signal $T_p$ are provided to the AND gate $31_i$ whose output signal resets the flip-flop $28_1$. The Q output of the flip-flop $28_1$ is connected to an AND gate $32_1$. The clock signal $T_c$ and signals from the high speed memory 14a are provided to the other input terminals of the AND gate $32_1$.

In the case that, for example, a timing signal is to be generated in the channel CH1 which is delayed for a time shorter than the carry signal period, 256 nanoseconds in this example, the flip-flop $28_1$ is set by the signal from the AND gate $29_1$ and thus its Q output becomes high level. Accordingly, when the mark is read out from the channel CH1 of the high speed memory 14a, the mark is outputted from the AND gate $32_1$ in synchronism with the clock signal $T_c$ and generated as a timing signal at the output terminal $1_1$ through the OR gate $21_1$.

On the other hand, in the case that the channel CH1 is not indicated to generate a timing signal within the carry signal period, an output signal from the AND gate $31_1$ resets the flip-flop $28_1$, since the inverted data of the register 25 is at high level, and thus the AND gate $32_1$ is kept closed from the first clock signal until 256 nanoseconds has elapsed. The counter 11 is incremented further by the clock signal, and when the marks provided from the low speed memories $14_b$, $14_c$ and $14_d$ coincide with each other, the AND gate $26_1$ generates a coincidence signal at its output. The coincidence signal is taken into the flip-flop $28_1$ by the carry signal from the terminal 27 immediately following the coincidence signal and its Q output becomes high level to open the AND gate 32. Thus, when the mark is read out from the channel CH1 of the high speed memory 14a, a timing signal with longer delay time than the carry signal period is generated at the output terminal $1_1$ via the AND gate $32_1$.

In the embodiment of FIG. 12, the least significant bit of the counter $11_b$ is preset to 1 by the reference signal Tp. As a result, the low speed memory $11_b$ is accessed one carry signal before the number of the carry signals supplied to the low speed memory $11_b$ to obtain one carry signal period margin in access time. Thus, as mentioned above, the low speed memories 14b to 14d which operate with a larger access time than the clock signal period can be used in this embodiment so that the embodiment becomes low in cost.

For example, in generating a timing signal 304 nano-seconds after the reference timing signal $T_p$, a mark 1 is stored in address 3 of the high speed memory $14_a$, since $304-256=48$ and $48/16=3$. Also a mark 1 is stored in address 1 of the low speed memory $14_b$. Further, low speed memories $14_c$ and $14_d$ each store a mark 1 in the 0th address. Accordingly, when the reference timing signal is supplied to the counter 11, the marks are read out from each of the low speed memories $14_b$, $14_c$ and $14_d$, since the counters $11_b$, $11_c$, and $11_d$ are preset to 1, 0 and 0, respectively, resulting in a high level at the output of the AND gate $26_1$. Thus the output Q of the flip-flop $28_1$ becomes high level by the carry signal from the terminal 27 generated 256 nano-seconds after the reference timing signal $T_p$ so that the AND gate $32_1$ is opened. Accordingly, by providing three clock signals to the counter $11_a$, that is 48 nano-seconds after the first carry signal, the mark 1 is read out from the address 3 of the high speed memory $14_a$. As a result, a timing signal delayed by 304 nano-seconds with respect to the reference signal $T_p$ appears at the output terminal $1_1$ since the AND gate $32_1$ is open.

Figure 13:
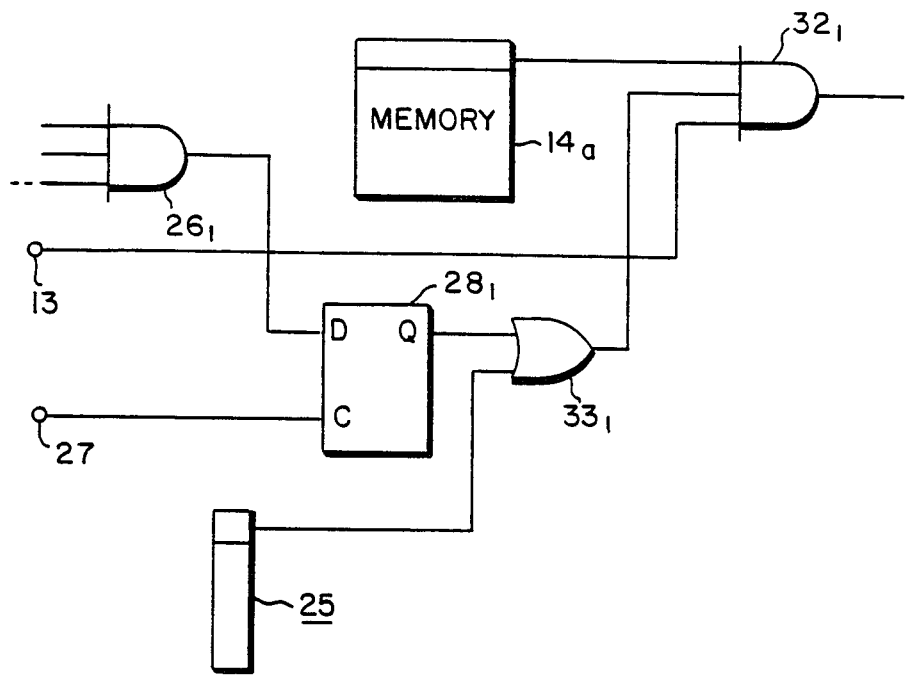
FIG. 13 is a circuit diagram of a modification of the embodiment of FIG. 12.

FIG. 13 shows another circuit configuration which can be used in the embodiment of FIG. 12. In FIG. 13, an OR circuit $33_1$ is provided between the flip-flop $28_1$ and the AND gate $32_1$. Data from the register 25 is supplied to one input of the OR circuit $33_1$, whose other input is provided with the Q output of the flip-flop $28_1$. The AND gate $29_1$ and the AND gate $31_1$ shown in FIG. 12 are eliminated in FIG. 13.

With regard to the embodiments of FIG. 12 and 13, it is possible to apply the timing set data as mentioned above in reference to FIG. 4, for selecting memory blocks to obtain a plurality of different timing signals with regard to the same channel.

Figure 14:
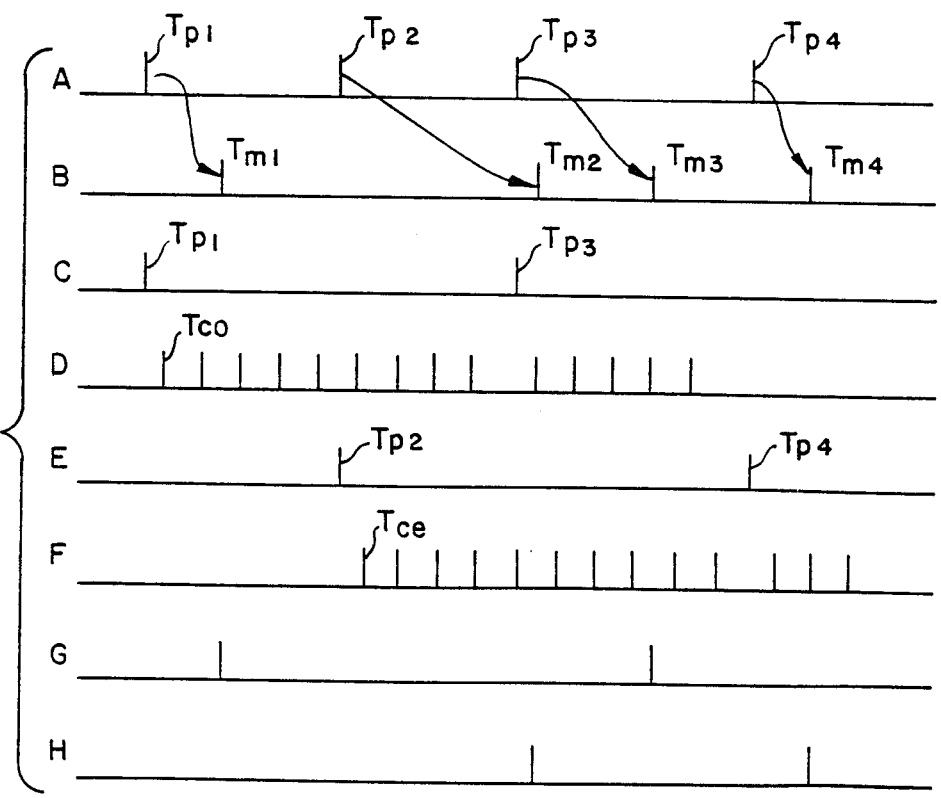
FIGS. 14A to 14H are timing charts for explaining the occurrence of a timing signal being delayed beyond the next reference signal.

At times it is desired to generate a timing signal delayed with respect to a reference signal beyond the occurrence of the next reference signal. For example, as shown in FIG. 14A, the reference timing signals Tp1, Tp2, Tp3 and Tp4 are generated in turn, and corresponding timing signals Tm1, Tm2, Tm3 and Tm4 are desired to be generated, as in FIG. 14B. In this case, the timing signal Tm2 corresponding to the reference signal Tp2 is generated after the occurrence of the next reference timing signal Tp3.

Figure 15:
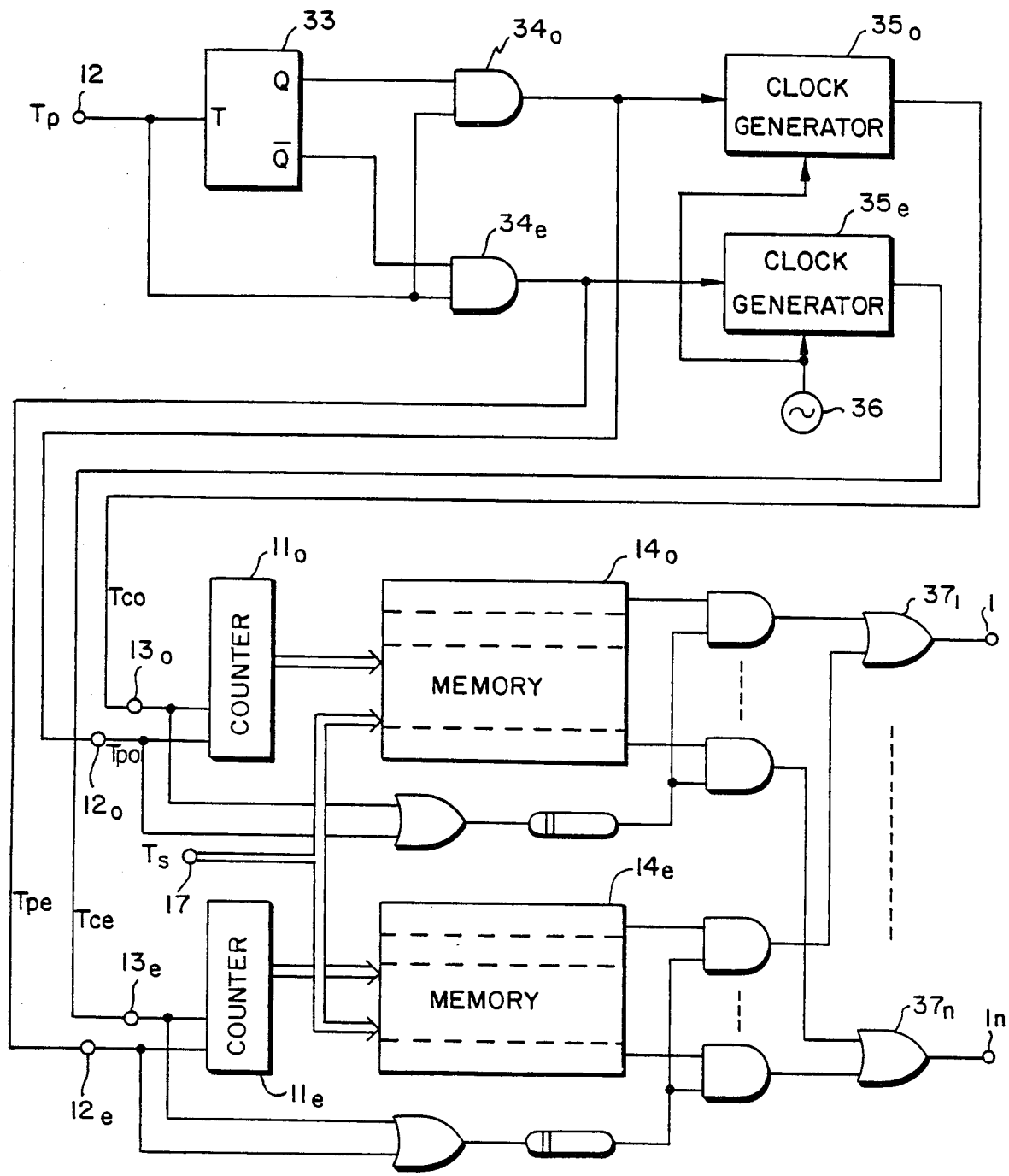
FIG. 15 is a circuit diagram of a timing signal generating apparatus of the present invention for generating timing signals after the occurrence of the next reference signal as shown in FIG. 14.

For obtaining a timing signal delayed beyond the next reference signal, a circuit diagram of a timing signal generating apparatus in accordance with the present invention is illustrated in FIG. 15. In the embodiment shown in FIG. 15, the reference signals are divided into two groups, such as Tp1, Tp2 and Tp3, Tp4 as in FIGS. 14C and 14E, respectively, and the clock signals corresponding to the divided reference signals are generated as shown in FIGS. 14D and 14F, respectively.

In FIG. 15, the reference signal provided from the terminal 12 is supplied to a toggle flip-flop 33 whose Q and $\overline{Q}$ outputs are connected to AND gates $34_o$ and $34_e$, respectively. The other terminals of the AND gates $34_o$ and $34_e$ are provided with the reference timing signal from the terminal 12 to generate divided reference timing signals at the outputs of the AND gate $34_o$ and $34_e$ as shown in FIGS. 14C and 14E. Clock signal generators $35_o$ and $35_e$ are triggered by the divided reference timing signals. The clock signal generators $35_o$ and $35_e$ generate clock signals Tco and Tce having equal periods, after receiving the reference signals as shown in FIGS. 14D and 14F, respectively. Counters $11_o$ and $11_e$ are provided corresponding to the divided reference signals Tpo and Tpe, that is, the counter $11_o$ receives the reference signal Tpo and the clock signal Tco, and the counter $11_e$ receives the reference signal Tpe and the clock signal Tce.

The mark memories $14_o$ and $14_e$ are accessed by the count values provided from the counters $11_o$ and $11_e$, respectively. The mark memories $14_o$ and $14_e$ are constructed with n-bits per word, where n is the number of channels required. The total number of storage locations of the memories $14_o$ and $14_e$ are decided by the maximum delay time with respect to the reference signal required for generating timing signals. Thus, in the event of generating a timing signal whose delay time extends beyond the next reference timing signal, the maximum number of storage locations in each of the mark memories $14_o$ and $14_e$ is selected for achieving a delay time longer than the time interval between the reference timing signals. Further, the timing set data $T_s$ from a terminal 17 is provided to the mark memories $14_o$ and $14_e$ to select respective blocks of the mark memories $14_o$ and $14_e$, as required by the alternating reference signals. Output signals from both the mark memories $14_o$ and $14_e$ are thusly provided to OR gates $37_1-37_n$ for each channel $1_1$ to $1_n$.

For generating a timing signal as shown in FIG. 14B in the channel CH1, the counter $11_o$ is preset by the reference signal $T_{p1}$ and then starts counting the clock signals so that the mark memory $14_o$ is accessed to generate a timing signal as shown in FIG. 14G. Since the reference signals are divided into two groups as described above, the counter $11_o$ is not preset by the reference signal Tp2. Likewise, the counter $11_e$ is not preset by the reference signal Tp3 and continues counting the clock signals. Accordingly, as shown in FIG. 14H, a timing signal corresponding to the reference signal Tp2 is generated by reading out the mark from the mark memory $14_e$ at a time later than the reference timing signal Tp3. The data read out from the mark memories $14_o$ and $14_e$ are combined at the OR gate $37_1$ to obtain the timing signals of FIG. 14B at the output of the OR gate 37.

If it is not known beforehand which timing signals will have to be generated by which of the two mark memories $14_0$ and $14_e$, then the same data must be stored in respective memory blocks of both mark memories. That is, the addresses wherein the marks are stored are identical in respective memory blocks of both mark memories, and each memory block is independently selected for each reference signal that is provided to each of the two mark memories.

Figure 16:
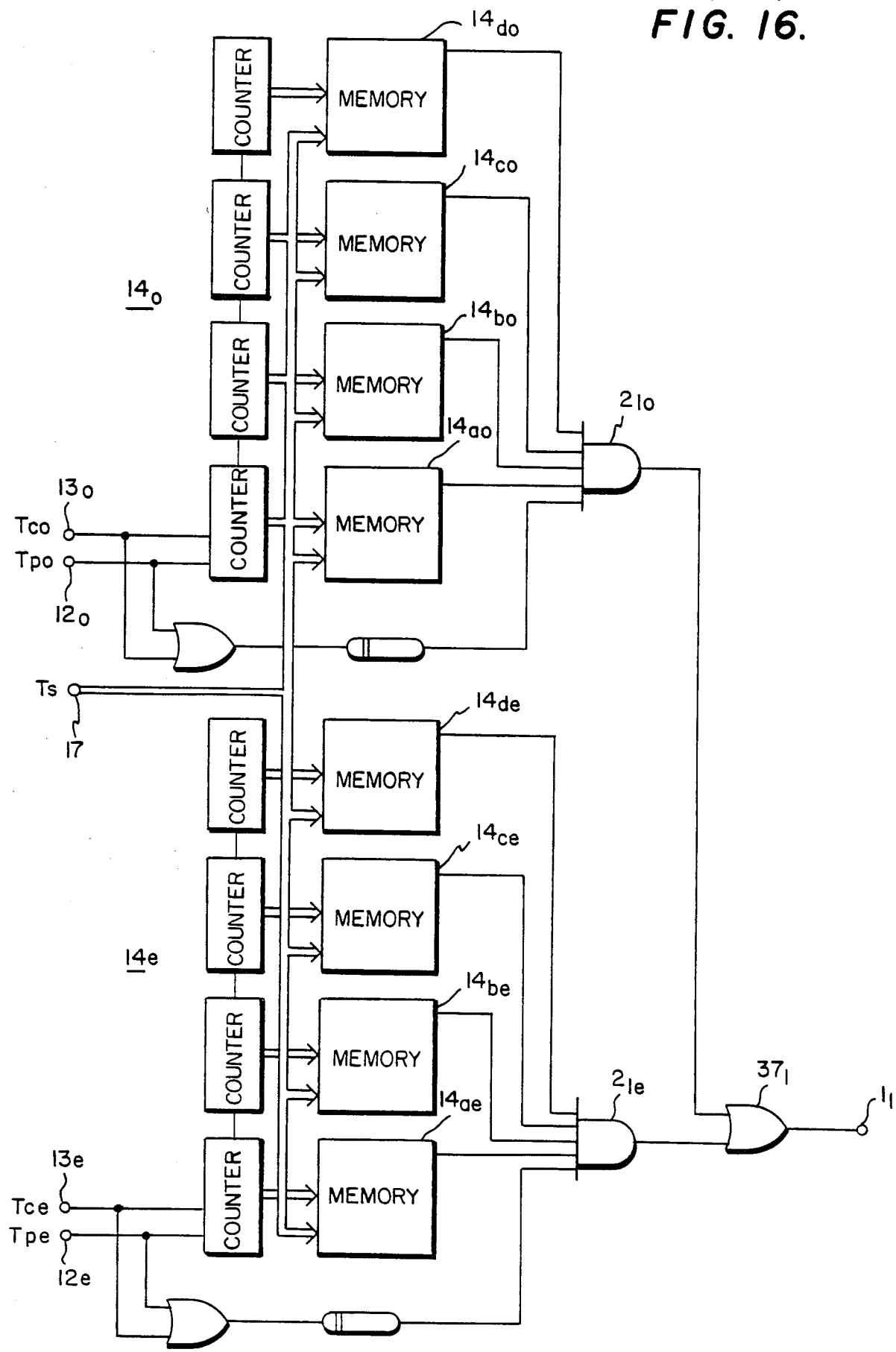
FIG. 16 is a circuit diagram of a timing signal generating apparatus which results from applying the feature shown in FIG. 15 to the apparatus shown in FIG. 6 or FIG. 7.

The present invention explained above in reference to FIG. 15 is applicable to the embodiment of FIG. 7, wherein the counter 11 and the mark memory 14 are divided for reducing the capacity of the mark memory 14 as illustrated in FIG. 16. Also, the embodiment of FIG. 15 is applicable to the embodiments shown in FIGS. 10 and 12. Further, although the reference timing signals are divided into two groups in the embodiment of FIG. 15, it is possible to divide the reference signals into three or more groups, for generating timing signals delayed beyond two subsequent signals, by providing a corresponding number of counters and mark memories.

In the embodiment mentioned above in reference to FIG. 15, a plurality of counters are arranged for accessing the mark memories $14_o$ and $14_e$. It is possible to provide a timing signal generating apparatus which uses only a single counter, for generating timing signals identical to those of the timing signals explained with regard to the embodiment of FIG. 15.

Figure 17:
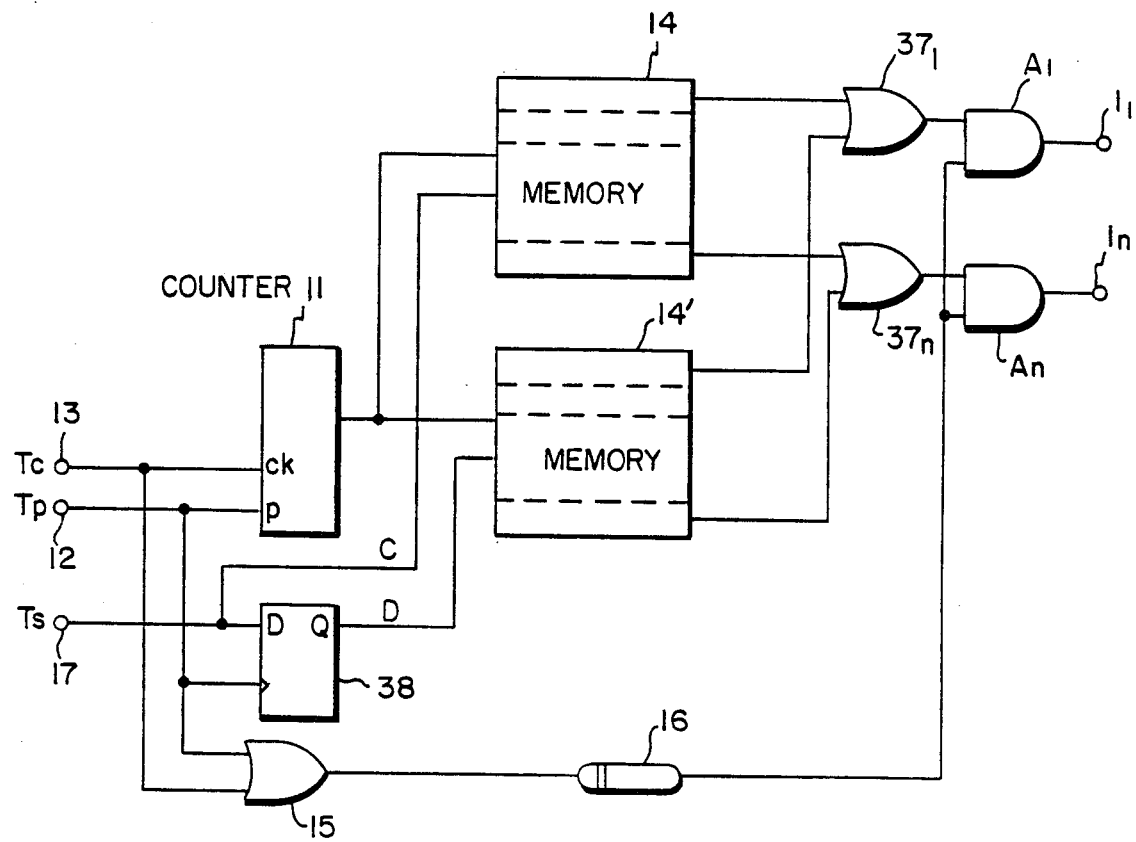
FIG. 17 is a circuit diagram of a variation of the timing signal generating apparatus shown in FIG. 15.

To accomplish this, a circuit diagram of another embodiment in accordance with the present invention is illustrated in FIG. 17. In FIG. 17, the mark memories 14 and 14' are commonly accessed by the counted data of the counter 11, and a timing set data from the terminal 17 is provided to both mark memories 14 and 14'. In this embodiment the timing set data to the mark memory 14' is provided one period of the reference signal later than that of the timing set data to the mark memory 14. For doing this, the timing set data $T_s$ from the terminal 17 is provided to a data terminal of a D-type flip 38, and the reference timing signal from the terminal 12 is provided to the clock terminal of the flip-flop 38. The timing set data taken in the flip-flop 38 is provided to the memory 14'. Thus the timing set data supplied to the mark memory 14' is shifted in phase and thereby delayed by one period of the reference signal. The mark memories 14 and 14' are constructed in the same way as the memories mentioned above, for example, the mark memories $14_o$ and $14_e$. However, the mark memory 14' is used only for obtaining a timing signal delayed with respect to a reference signal beyond the occurrence of the next reference signal. In this embodiment a mark is stored in the address corresponding to the time interval between the next reference signal and the timing signal to be generated, that is, corresponding to the time interval which starts at the occurrence of the next reference signal and ends at the generation of the desired timing signal.

In FIGS. 18A to 18D a timing chart is illustrated for explaining the operation of the embodiment of FIG. 17. In FIG. 18A the reference signals Tp1, Tp2, Tp3 and Tp4 are provided to generate corresponding timing signals $S_1$, $S_2$, $S_3$ and $S_4$. As shown in FIG. 18B the timing signal $S_2$ which corresponds to the reference signal Tp3 is generated after the next reference signal Tp3 by the time interval $D_2$. Thus in the mark memory 14' a mark 1 is stored in the address corresponding to the time interval $D_2$. The data read out from the mark memories 14 and 14' is combined by OR gates $37_1$ to $37_n$ for each channel and provided to output terminals $1_1$ to $1_n$ in synchronization with the clock signal by the AND gates $A_1$ to $A_n$.

When the reference signals shown in FIG. 18A are supplied to the counter 11 from the terminal 12, the counter 11 is preset and then starts counting the clock signal Tc that is provided from the terminal 12. After the generation of the reference signal Tp1, the timing set data 1 as shown in FIG. 18C is provided to the mark memory 14 and also to the flip-flop 38 so that the mark memory 14 is selected to generate a timing signal $S_1$. By the second reference signal Tp2, the timing set data 1 is taken into the flip-flop 38 as shown in FIG. 18D and the counter 11 is preset again. Thus, during the time interval between the reference signals Tp2 and Tp3 the timing set data 1 is provided to the mark memory 14' and timing set data 2 is provided to the mark memory 14. In this example, since the timing signal $S_2$ is desired to be generated after the third reference signal Tp3, the marks are not read out from either the mark memory 14 or 14' during this time interval. When the third reference signal Tp3 is supplied to the counter 11 and the flip-flop 38, the counter 11 is preset and the timing set data 2 is taken into the flip-flop 38. Thus, after generation of the reference signal Tp3, the timing set data 3 is provided to the mark memory 14 whereas the timing set data 2 is provided to the mark memory 14'. Thus when the counted data of the counter 11 becomes the address corresponding to the delay time $D_2$, the mark is read out from the mark memory 14' to generate the timing signal $S_2$. Also, when the counter 11 accesses the address corresponding to the timing signal $S_3$, the mark is read out from the mark memory 14 and outputted at the terminal $1_1$ via the OR gate $37_1$.

Figure 19:
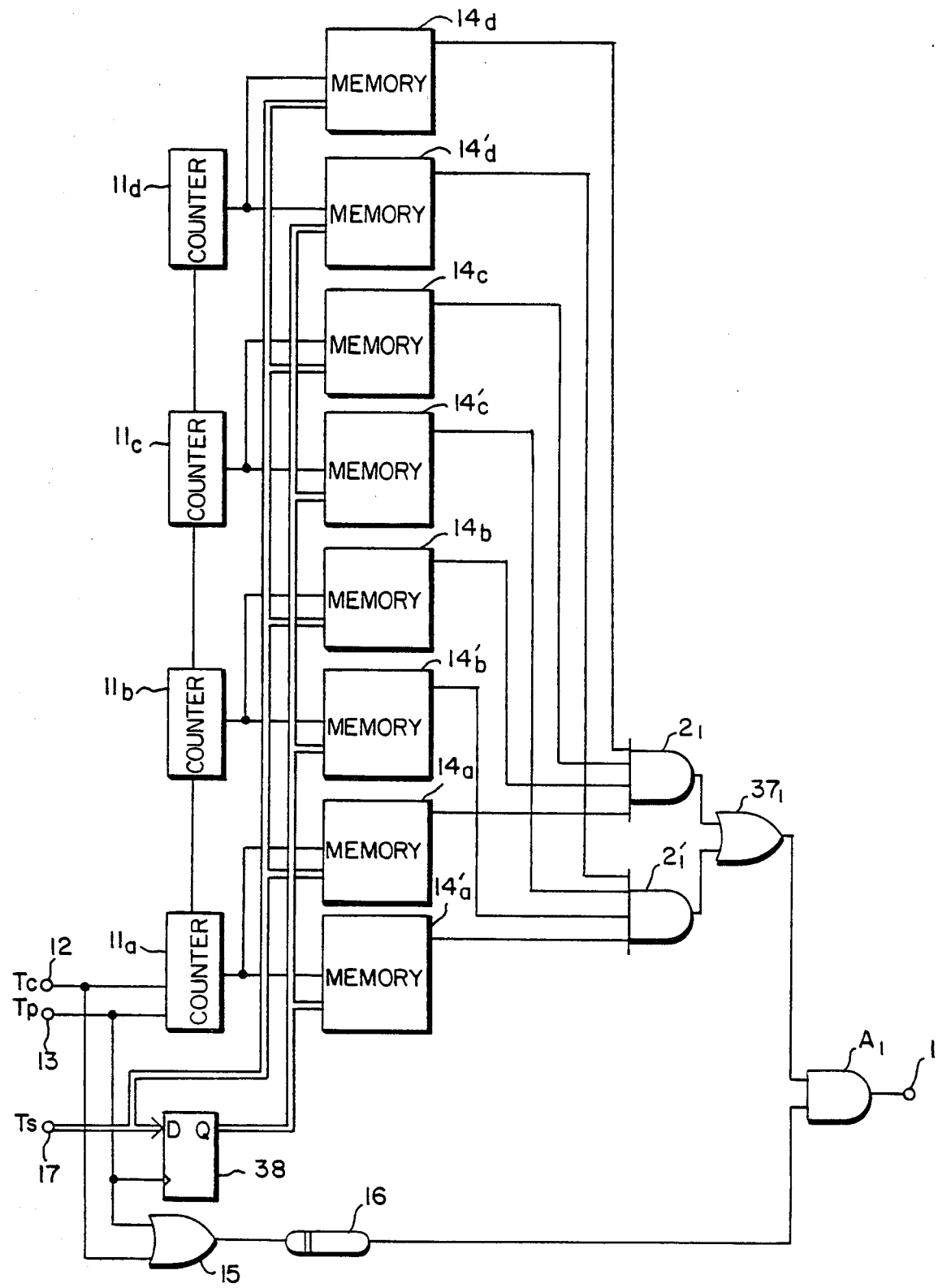
FIG. 19 is a circuit diagram of a timing signal generating apparatus which results from combining the apparatus of FIG. 17 with the apparatus of FIG. 6.

The invention explained above in reference to FIG. 17 is applicable to the other embodiments mentioned above. For example, one of the embodiments derived by applying the invention of FIG. 17 to the embodiment of FIG. 6 is illustrated in FIG. 19. In FIG. 19 the timing set data Ts from the terminal 17 is provided to the mark memories $14_a$ to $14_d$ and the timing set data Ts' delayed by the flip-flop 38 by one period of the reference signal is provided to the mark memories $14_a'$ to $14_d'$. The mark memories $14_a$, $14_a'$ to $14_d$ to $14_d'$ are accessed by the contents of the counters $11a$ to $11d$, respectively. Output signals from the mark memories $14_a$ to $14_d$ are provided to the AND gate $2_1$ and output signals from the mark memories $14_a'$ to $14_d'$ are provided to the AND gate $2_1'$, respectively, for the channel $CH_1$. The outputs of the AND gates $2_1$ and $2_1'$ are combined by the OR gate $37_1$ to generate a timing signal at the terminal $1_1$ via the AND gate $A_1$.

Figure 18:
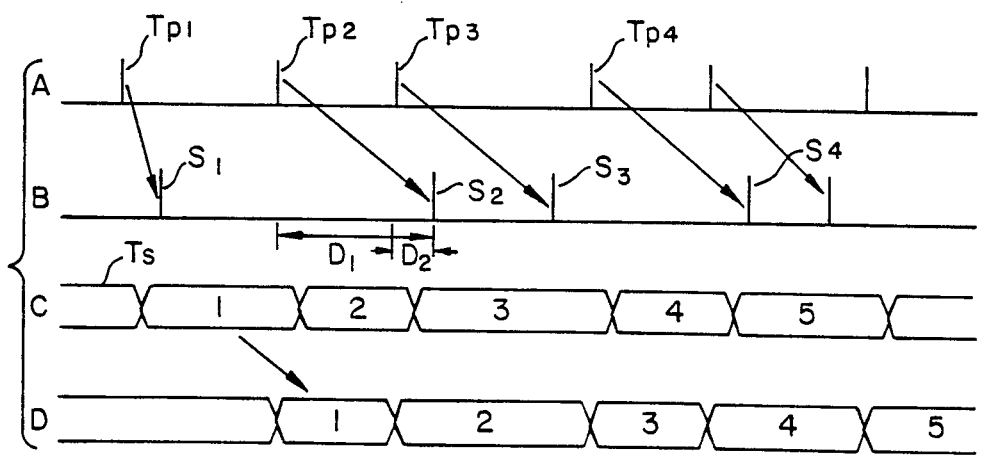
FIGS. 18A to 18D are timing charts for explaining the operation of the embodiment of FIG. 17.

For generating a timing signal that is delayed, for example, by 1.5 milli-seconds with respect to the reference signal, while the time interval of the reference signal is 1 milli-second and the period of the clock signal Tc is 16 nano-seconds, the embodiment of FIG. 20 operates as follows. In this case a fraction of the delay time corresponding to the time interval $D_2$ shown in FIG. 18 is 0.5 milli-seconds. The binary data which represents this 0.5 milli-seconds is 0111101000001010, and this binary data is divided into four, that is, as 1010, 0000, 1010 and 0111, each of which is provided to the corresponding mark memories $14_a'$ to $14_d'$ as address data. Each mark memory $14_a'$ to $14_d'$ stores the mark 1 at the corresponding location represented by the divided address data. As a result, a timing signal is generated 0.5 milli-seconds after the next reference signal.

Figure 20:
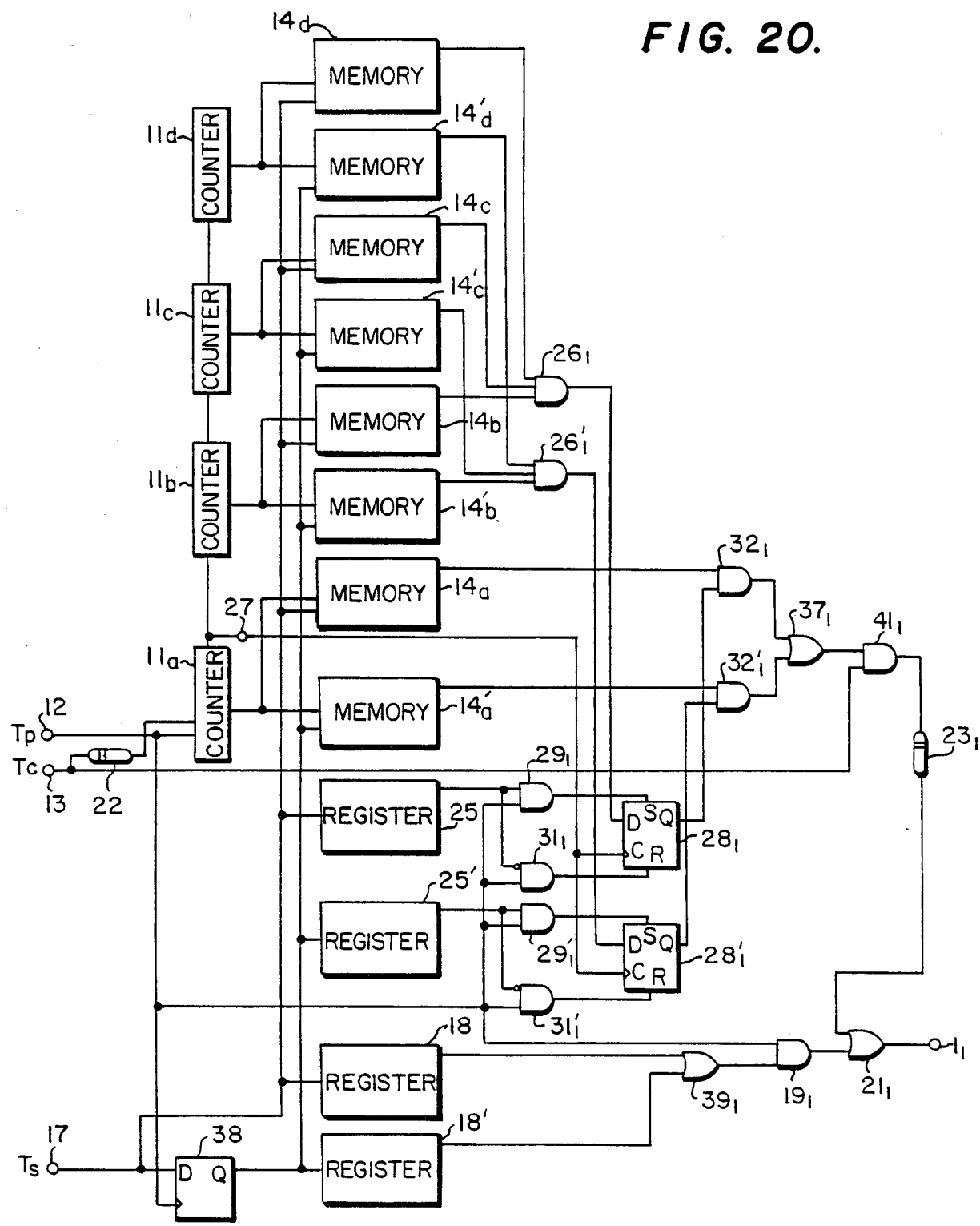
FIG. 20 is a circuit diagram of a timing signal generating apparatus which results from combining the apparatus of FIG. 17 with the apparatus of FIG. 12.

Further, as is illustrated in FIG. 20, the feature shown in FIGS. 17 and 19 is also applicable to the embodiment of FIG. 12. In FIG. 20, the mark memories $14_a'$ to $14_d'$ are provided in the same way as in the embodiment of FIG. 19, although the memory $14_a'$ operates at high speed and the other memories $14_b'$ to $14_d'$ operate at low speed. An AND gate $26_1'$ is provided for detecting the coincidence of the signals from the low speed memories $14_b'$ to $14_d'$. A register 18' is provided for indicating whether or not the fraction of the delay time corresponding to $D_2$ shown in FIG. 18 is greater than the time period of the clock signal $T_c$. Both outputs of the registers 18 and 18' are supplied to the AND gate $19_1$ via an OR gate $39_1$. Further, a register 25' is provided for indicating whether or not the fraction of the delay time corresponding to $D_2$, that is, from the next reference timing signal to the occurrence of the timing signal, is greater than the period of the carry signal from the terminal 27.

The output of the register 25' is provided to flip-flops $29_1'$ and $31_1'$, whose other terminals are provided with the reference signal in the same way as the circuit connection regarding the register 25. A flip-flop $28_1'$ is set and reset by the output signals from the AND gates $29_1'$ and $31_1'$, respectively. An output of the AND gate $26_1'$ is supplied to a data terminal of the flip-flop $28_1'$ whose Q output is connected to an AND gate $32_1'$. The signal that is read out from the mark memory $14_a'$ is provided to the other terminal of the AND gate $32_1'$. The outputs of both AND gates $32_1$ and $32_1'$ are supplied to the OR gate $37_1$ and provided to the OR gate $21_1$ through the AND gate $A_1$. The timing set data from the terminal 17 is provided to the registers 25 and 18 and the timing set data delayed by the flip-flop 38 is provided to the registers 25' and 18'. Further detail of the operation of the embodiment of FIG. 20 is not explained in the following since it is understandable from the preceding explanation.

Figure 21:
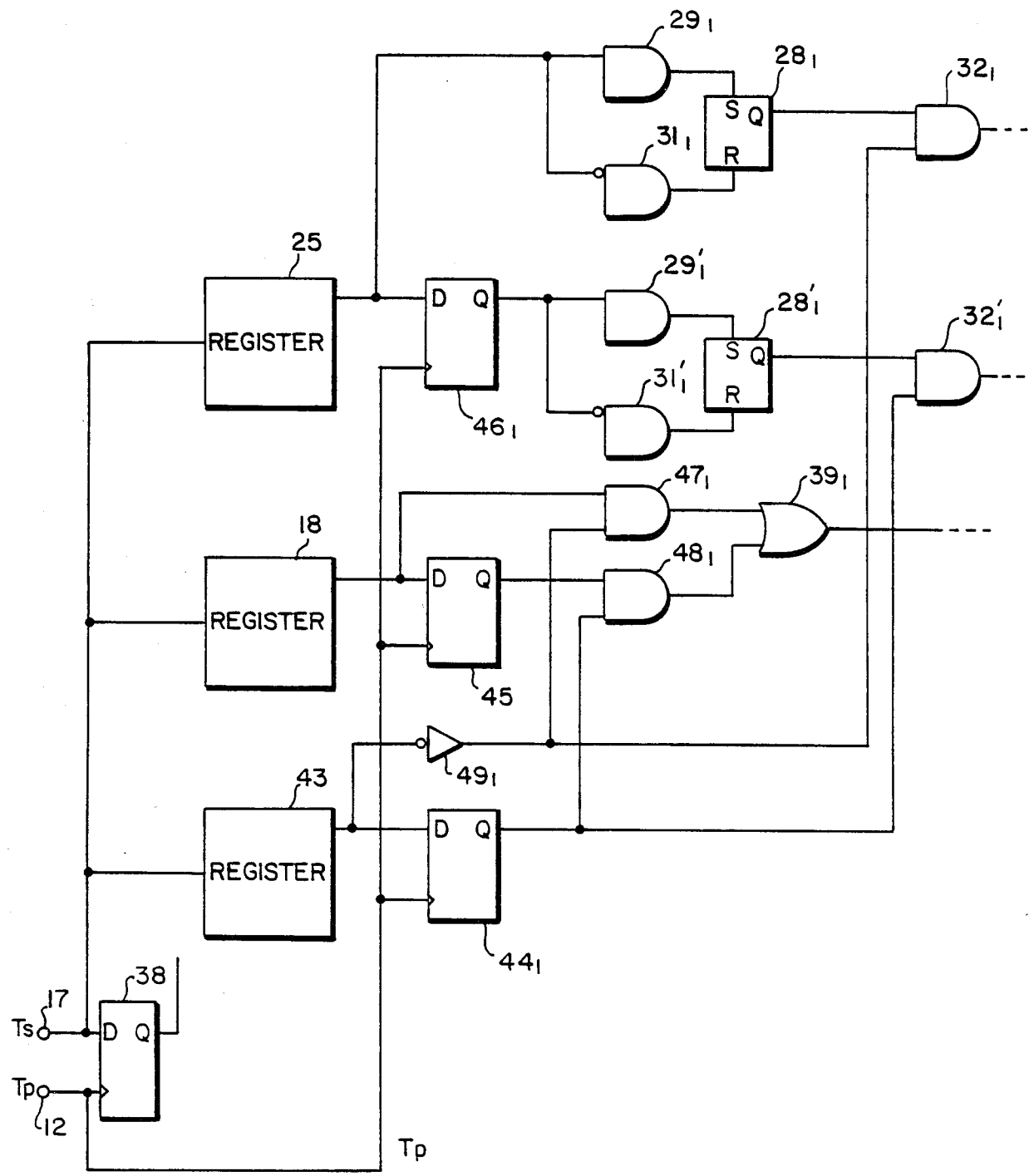
FIG. 21 is a circuit diagram of a modification of the embodiment of FIG. 20.

Although in the embodiment of FIG. 20 the registers 18, 18' 25 and 25' are employed, it is possible to reduce the number of registers as illustrated in FIG. 21. In FIG. 21, besides the registers 18 and 25, a register 43 is provided for indicating whether or not a timing signal is intended to be generated after the occurrence of the next reference signal. The register 43 is accessed by the timing set data from the terminal 17. Each data for the channel $CH_1$ of the registers 25, 18 and 43 is supplied to the data terminals of D-type flip-flops $46_1$, $45_1$ and $44_1$, whose clock terminals are provided with the reference signals from the terminal 12 to take in the data from the registers 25, 18 and 43, respectively. Thus, at the Q outputs of the flip-flops $44_1$, $45_1$, and $46_1$, the data that indicates whether or not a timing signal is generated after the occurrence of the next reference signal, the data that indicates whether or not a timing signal is delayed within the clock signal period, and the data that indicates whether or not a timing signal is delayed within the carry signal period, are made to appear, respectively, with one reference signal period delay. Data from the register 43 is also provided to both an AND gate $47_1$ and the AND gate $32_1$ via an inverter 49, and the delayed data of the register 43 is provided from the flip-flop $44_1$ to both AND gates $48_1$ and $32_1'$. The data from the register 18 and its delay data are supplied to AND gates $47_1$ and $48_1$, respectively. Both outputs of the AND gates $47_1$ and $48_1$ are supplied to the OR gate $39_1$ to generate combined data at the output of the OR gate $39_1$. Data from the flip-flop $46_1$ is provided to the AND gates $29_1'$ and $31_1'$ for operation as in FIG. 20.

In the case that the data from the register 43 is 0, signifying that a timing signal is to be generated before the occurrence of the next reference signal, the data from the register 18 is ouputted at the OR gate $39_1$ since the AND gate $47_1$ is opened by the inverted data of the register 43. The flip-flop $28_1$ is set by the data from the register 25 to open the AND gate $32_1$. Thus in this case the embodiment of FIG. 21 operates as described above in reference to FIG. 12, since the data from both the registers 25, 18 is ready to be supplied to the subsequent circuits.

In the case that the data of the register 43 is 1, the AND gates $47_1$ and $32_1$ are closed since the data from the register 43 is inverted, whereas the AND gate $48_1$ is opened by the next reference signal. Accordingly, the data from the register 18 that is delayed by one period of the reference signal is outputted at the output of the OR gate $39_1$ and the delayed data of the register 25 from the flip-flop $46_1$ sets the flip-flop $28_1'$, and is provided at the output of the AND gate $32_1'$. Accordingly, this embodiment works according to the operation described in reference to FIGS. 17 and 18, and thus a timing signal is generated after the next reference signal.

Figure 22:
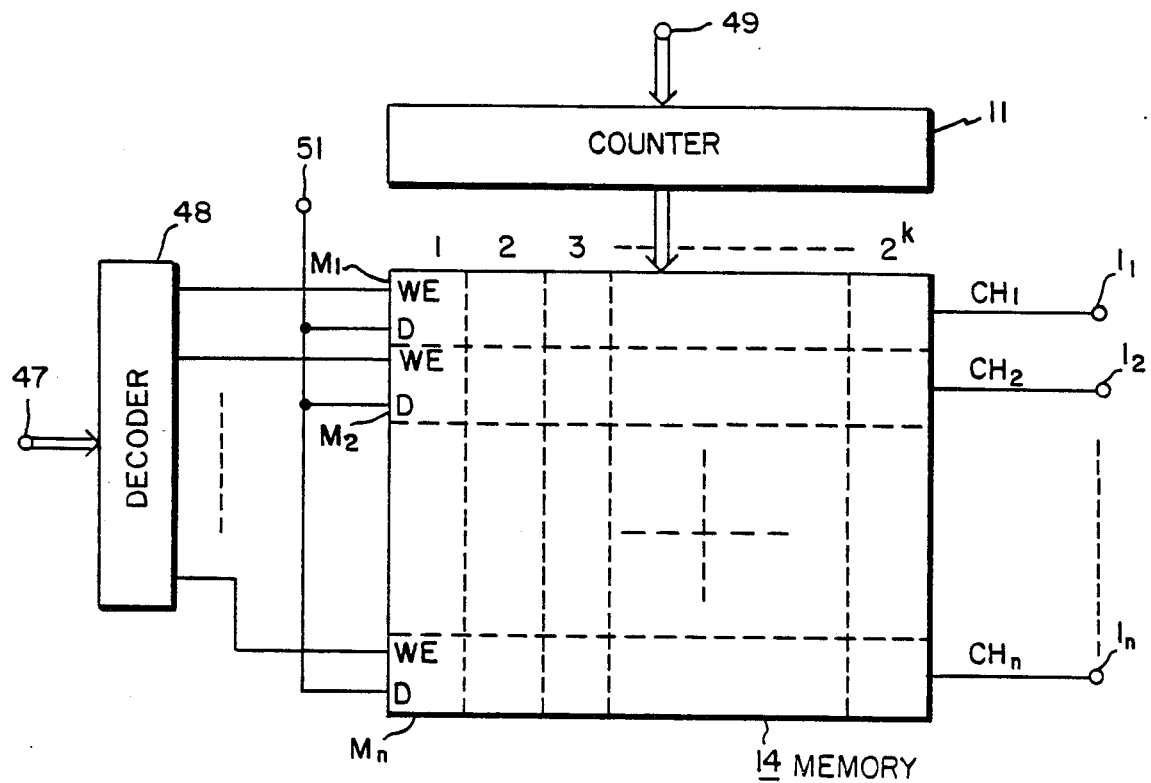
FIG. 22 is a circuit diagram showing a configuration for writing data into the mark memory.

FIG. 22 shows a circuit diagram for writing the mark data into the mark memory. Channel select data for selecting channels wherein marks are stored is provided to a decoder 48 from a terminal 47. The channel select data selects a write enable terminal WE of one of the memories $M_l-M_n$. Data for presetting the counter 11 is provided to the counter 11 from a terminal 49. The preset data in the counter 11 is the address of the mark memory 14 corresponding to the delay time of a timing signal with respect to a corresponding reference signal. The data 1 is provided at the terminal 51, and the mark is stored in the selected address of the selected channel of the mark memory. The data in the other storage locations of the mark memories $M_l-M_n$ should be 0. Thus before writing in a mark 1 as mentioned above, all the storage locations of the mark memory must be loaded with the data 0, since the addresses wherein the marks 0 and 1 were previously stored are not known. In this case, writing 0 into all the storage locations of the mark memory takes a long time.

Figure 23:
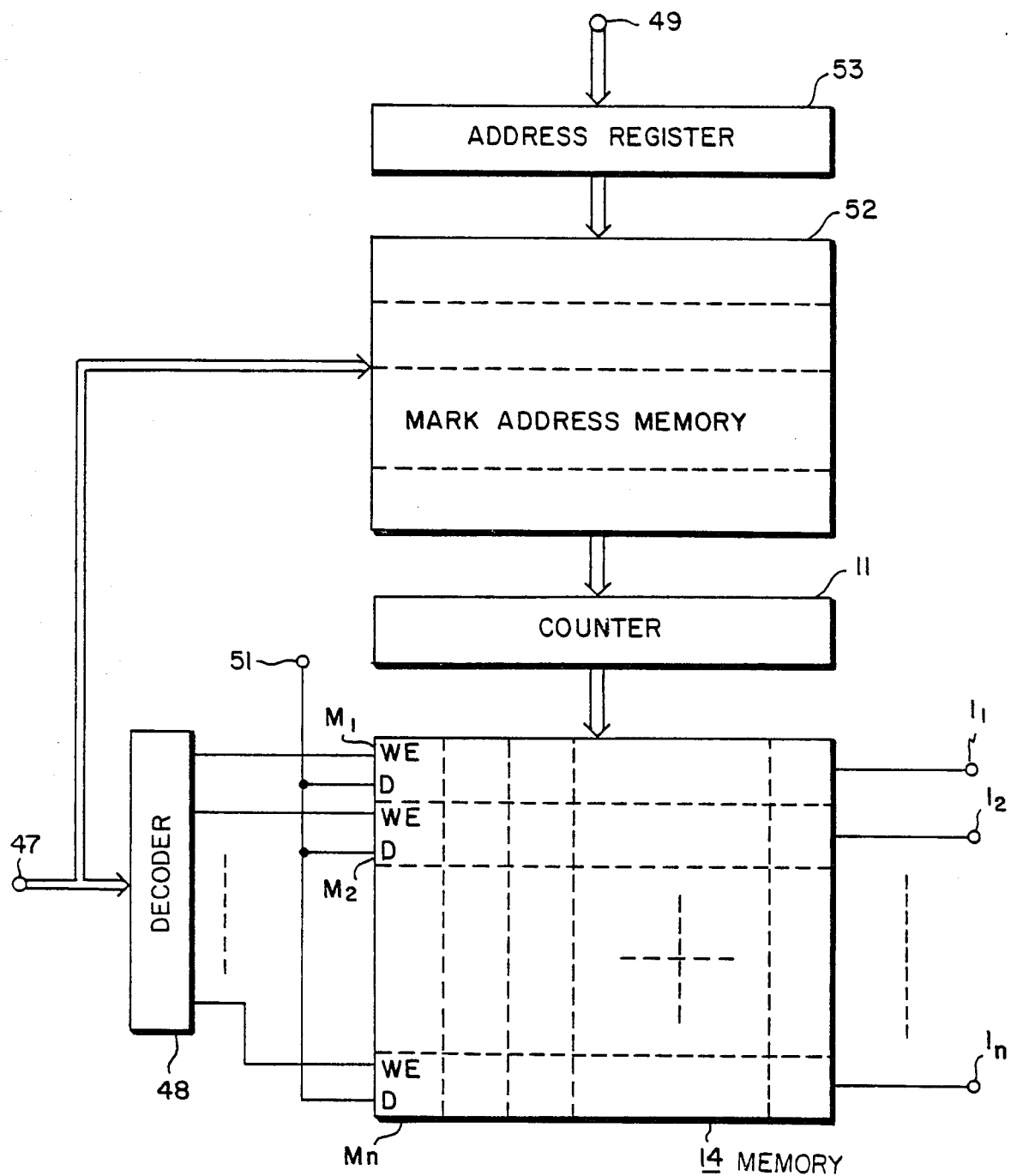
FIG. 23 is a circuit diagram showing a configuration for writing data into the mark memory of the present invention.

FIG. 23 shows a circuit diagram for reducing the time required for changing storage locations wherein the marks are stored. In FIG. 23, a mark address memory 52 is provided for storing the address data of each mark previously stored in the channels of the mark memory 14. An address register 53 supplies new address data indicating a memory location wherein each mark is to be stored, this data being provided from the terminal 49 to the mark address memory 52. The address data stored in the mark address memory 52 is read out by the channel select data supplied from the terminal 47, and at the same time the new address data from the address register 53 is stored in the same channel of the mark address memory 52.

In writing 0 into all the addresses of the mark memory 14 in this embodiment, the address data which indicates the address of the mark memory 14 wherein a mark 1 is stored is read out by the channel select data and presets the counter 11 to access the mark memory 14. Also the channel of the mark memory 14 is selected by the channel select data provided by the decoder 48, and data 0 is provided at the terminal 51. Thus, the storage locations of the mark memory 14 wherein each mark 1 was written are addressed and changed to 0, resulting in the data in all the storage locations becoming 0. At the same time, the new address wherein the mark 1 is intended to be stored is provided from the address register 53 and is stored in the same channel of the mark address memory 52 which is being selected by the channel select data. This process is repeated for each channel until the marks of all the channels of the mark memory 14 are changed to 0 and also the new address data for all channels are stored in the mark address memory 52.

In writing the new marks into the mark memory 14, the new address data for each channel is sequentially read out from the mark address memory 52 by the channel select data. At the same time, the channel of the mark memory 14 which is identical to that of the mark address memory 52 is selected, and the terminal 51 is set to high level. Thus the new data corresponding to the delay time of the new timing signals for n channels will be stored by repeating this procedure n times.

Some devices under test, such as a micro-processor for example, operate with timings that are determined by a signal which the device itself generates, for instance, an address latch enable signal, and not by a clock signal provided from the timing signal generating apparatus. The time difference between the clock signal and the address latch enable signal generally varies from device to device. For generating timing signals for such devices, mark address data must be shifted by the corresponding time difference. However, generation of the mark address data including the information on the time differences by CPU operation requires additional operation time and thus the test speed is limited.

Figure 24:
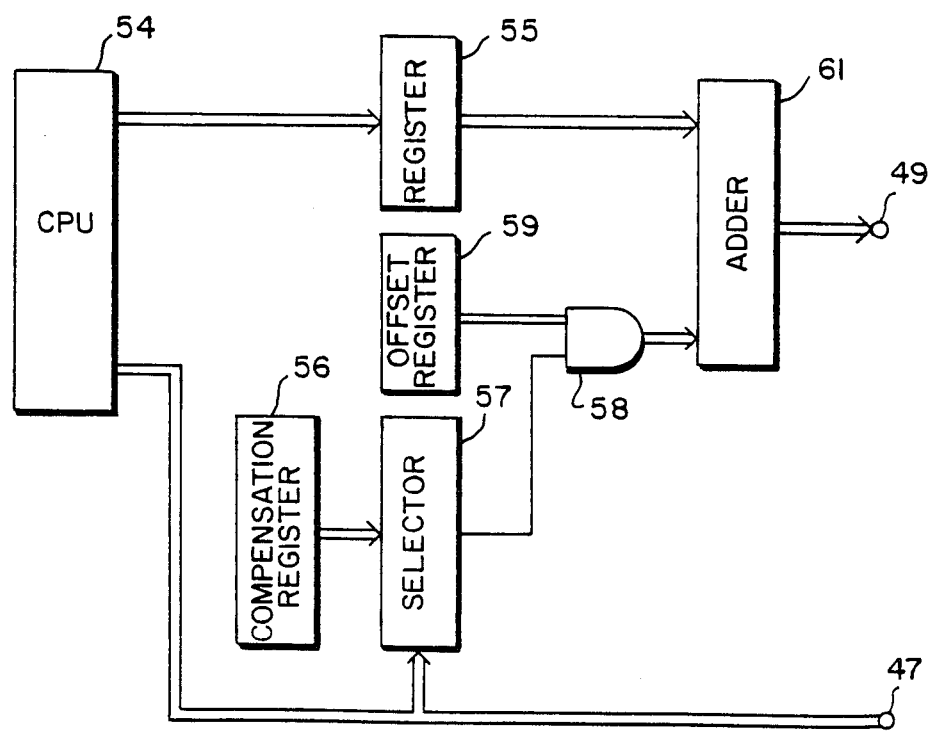
FIG. 24 is a circuit diagram showing an embodiment of the present invention for changing addresses while writing the marks into the mark memory.

FIG. 24 shows a circuit diagram for providing mark addresses to the mark memory for generating timing signals for the devices mentioned above. In FIG. 24 mark address data that indicates the timings of the timing signals is provided from a CPU 54 to a register 55. The CPU 54 also provides channel select data to the terminal 47. A register 56 is provided for storing data indicating for each channel whether or not a compensation of the timing is required, and the stored data in the register is selected by the channel select data at a selector 57.

If compensation is required, the selector 57 opens an AND gate 58 whose other terminals are provided with offset data from a register 59. The offset data in the register 59 corresponding to the time required for compensation, for example, the time difference between the clock signal and the address latch enable signal. The offset is provided through the AND gate 58 to an adder 61 wherein the offset data is added to the mark address data. As a result, compensated mark address data is generated at the terminal 49. As has been described, by storing the offset data in the register 59, the mark address data is automatically compensated.

What is claimed is:

1. A device for generating timing signals corresponding to reference signals and clock signals, comprising
    counting means for being preset by each said reference signal, for counting the clock signals which occur after each said reference signal, and for outputting the count value,
    memory means for storing marks in addresses corresponding to delay times of said timing signals with respect to said reference signals, and
    means for synchronizing said timing signals with said clock signals,
    wherein said count value of said counting means is used to access the addresses of said memory means so that said marks are provided from said memory as said timing signals, said timing signals are provided on a plurality of channels, said memory means includes a corresponding plurality of channels, each said channel of said memory has the same set of addresses to be accessed by the count value of said counting means, and said marks are selectively stored in the addresses of said channels in correspondence to the desired timing signals to be output from each of said channels.

2. The device of claim 1, comprising
    said counting means including a plurality of counters arranged serially, said clock and reference signals being provided to at least a first of said counters, the carry signal of each of said counters being provided as the clock signal to the subsequent one of said plurality of counters,
    said memory means including a plurality of memories corresponding to said plurality of counters, each of said memories being accessed by the count value of the respective counter to output the respective marks on the respective channels, each said memory having said plurality of channels,
    a plurality of gate means corresponding to said plurality of channels, wherein the outputs of the same channel of all of said memories are input to the respective one of said gate means,
    a delay element for delaying the clock signals to be counted by said counters,
    a plurality of synch means for synchronizing the outputs of each said channel of said memories with said clock signals,
    a plurality of second delay means respectively connected with said plurality of synch means for synchronizing the respective outputs of said synch means to begin to occur one clock signal period after the occurrence of the respective reference signal, and
    a register for outputting data for indicating whether or not a timing signal is to be output for each said channel within less than one clock signal period after the respective reference signal,
    wherein said timing signals are provided for each said channel depending on the output from at least one of said gate means and from said register.

3. The device of claim 2, comprising
    each said memory including plural memory blocks, each said memory block having said plurality of channels, and
    selecting means for selecting which of said memory blocks is to be accessed by the count value of the respective counter.

4. The device of claim 1, comprising
    said memory means comprising two memories, each said memory having said plurality of channels and being simultaneously addressed by said counting means, and each said memory including a plurality of memory blocks, with corresponding memory blocks of the two memories storing marks at the same addresses of each channel,
    selecting means for selecting one of the blocks for a first one of said memories and, upon occurrence the subsequent one of said reference signals, for selecting a subsequent block for the first memory while selecting for the second one of said memories the memory block corresponding to the block that was previously selected for the first memory,
    wherein a timing signal corresponding to a respective reference signal can be provided after the subsequent reference signal.

5. The device of claim 4, comprising
    said counting means comprising a plurality of counters arranged serially, said clock and reference signals being provided to at least a first of said counters, the carry signal of each said counter being provided as the clock signal for the subsequent one of said counters,
    each said memory comprising a plurality of memories corresponding to said plurality of counters, and each said memory being accessed by the count value of the respective counter,
    wherein said timing signals for each said channel are provided depending on the outputs of the respective channels of said memories.

6. The device of claim 5, comprising
    each said first counter being a high speed counter and each other of said counters being a low speed counter,
    two pairs of registers, a first pair of said registers outputting data indicating whether the timing signal which is to be generated is within one clock period of the respective reference signal, and the second pair outputting data indicating whether a timing signal is to be generated within the carry over period of the respective first counter, wherein said timing signals for said channels are provided depending further on the respective outputs of said registers.

7. A device for generating timing signals corresponding to reference signals and clock signals, comprising counting means for being preset by each said reference signal, for counting the clock signals which occur after each said reference signal, and for outputting the count value, memory means for storing marks in addresses corresponding to delay times of said timing signals with respect to said reference signals, said counting means including a plurality of counters arranged serially, said clock and reference signals being provided to at least a first one of said counters, the carry signal of each of said counters being provided as the clock signal for the subsequent one of said plurality of counters, and said memory means including a plurality of memories corresponding to said plurality of counters, and each of said memories being accessed by the count value of the respective counter, wherein said count value of said counting means is used to access the addresses of said memory means so that said marks are provided from said memory as said timing signals, said timing signals are provided on a plurality of channels, said memory means includes a corresponding plurality of channels, each said channel of said memory has the same set of addresses to be accessed by the count value of said counting means, said marks are selectively stored in the addresses of said channels in correspondence to the desired timing signals to be output from each of said channels, and said timing signals are provided depending on outputs of the corresponding channels of said memories.

8. The device of claim 7, comprising each said memory having said plurality of channels, and a plurality of gate means corresponding to said plurality of channels, wherein the outputs of the same channel of all of said memories are input to the respective one of said gate means and said timing signals are provided depending on the output from at least one of said gate means.

9. The device of claim 7 or 8, comprising the one of said plurality of memories corresponding to said first counter being a high speed memory, and the others of said memories being low speed memories, and a register for outputting data for indicating whether or not a timing signal is to be output on each of said channels within the carry signal period of said first counter, wherein said timing signals are provided on respective channels depending further on the output of said register.

10. The device of claim 9, comprising a register for outputting data for indicating whether or not a timing signal is to be output for each said channel within less than one clock signal period after the respective reference signal wherein said timing signals are provided on said channels depending further on the output of said register.

11. The device of claims 1, 7 or 8, comprising each said memory including a plurality of memory blocks, each said memory block having a respective set of said marks stored therein, and selecting means for selecting which memory block of each said memory is to be accessed by the count value of the respective counter for outputting the respective timing signals.

12. A device for generating timing signals corresponding to reference signals and clock signals, comprising counting means for being preset by each said reference signal, for counting the clock signals which occur after each said reference signal, and for outputting the count value, memory means for storing marks in addresses corresponding to delay times of said timing signals with respect to said reference signals, and said counting means comprising close-count means for assuring that one of the clock signals will be properly counted when the next reference signal occurs close to that clock signal, wherein said count value of said counting means is used to access the addresses of said memory means so that said marks are provided from said memory as said timing signals.

13. The device of claim 12, comprising a first delay element for delaying the clock signals that are counted by said counting means, a plurality of synch means for synchronizing the output of each said channel of said memory means with said clock signals, a plurality of second delay means respectively connected to said plurality of synch means for synchronizing the respective outputs of said synch means to begin occurring one clock signal period after the occurrence of each said reference signal.

14. The device of claim 12 or 13, comprising a register for indicating whether or not a timing signal is to be output for each said channel within less than one clock signal period after each respective reference signal.

15. The device of claim 7 or 12 comprising a mark address memory for storing data representing the addresses of said mark memory at which said marks were previously stored, an address register for storing the addresses of said mark memory at which the next set of marks corresponding to the next set of timing signals are to be stored, and control means for accessing each said address of said memory means at which one of said marks was written and for erasing same, by means of writing each said address sequentially into said counting means, wherein said next set of marks are written into said memory, wherein the marks previously stored in said mark memory may be rapidly changed to said next set of marks to provide the next set of corresponding timing signals.

16. The device of claim 15, comprising an adder for adding together said data of the address at which said marks are to be stored with any respective offset data before supplying same to said address register, means for providing said offset data to said adder, and a generator for providing said data to said adder, whereby compensated timing signals can be generated by said device, for use in testing devices wherein said timing signals include timing signals the timing of which is determined by the device under test.

17. The device of claim 16, said memory means and said mark memory comprising said plurality of channels, wherein said erasing of previously written marks in said mark memory, and said writing in of marks corresponding to the next set of timing signals, occurs sequentially for said channels.

18. The device of claim 15, said memory means and said mark address memory comprising said plurality of channels for providing said timing signals for respective channels, wherein said erasing or previously written marks in said mark memory, and said writing in of marks corresponding to the next set of timing signals, occurs sequentially for said channels.

19. A device for generating timing signals corresponding to reference signals and clock signals, comprising counting means for being preset by each said reference signal, for counting the clock signals which occur after each said reference signal, and for outputting the count value, memory means for storing marks in addresses corresponding to delay times of said timing signals with respect to said reference signals, at least two of said counting means, at least two of said memory means, a divider for providing successive ones of said reference signals alternately to each of said at least two counting means, at least two clock signal generators, each one providing said clock signals to a respective one of said counting means for the period between each successive pair of said alternate reference signals that are provided to the same one of said counting means, and a plurality of OR gates for combining the respective channel outputs of said at least two memory means, said count value of said counting means is used to access the addresses of said memory means so that said marks are provided from said memory as said timing signals said timing signals are provided on a plurality of channels, said memory means includes a corresponding plurality of channels, each said channel of said memory has the same set of addresses to be accessed by the count value of said counting means, said marks are selectively stored in the addresses of said channels in correspondence to the desired timing signals to be output from each of said channels; and any one of said timing signals corresponding to any one of said reference signals may be provided after at least the subsequent reference signal, said timing signal occurring before the subsequent reference signal that is supplied to the same counting means.

20. The device of claim 19, comprising each said counting means comprising a plurality of counters, at least the first of said counters receiving said clock and reference signals, and each counter of the plurality of counters providing its carry output to the following counter, each said memory means comprising a plurality of memories corresponding to the respective plurality of counters, and a plurality of gates, each said gate receiving all the outputs of said memories corresponding to a respective channel, wherein said timing signals for said channels are provided depending on the output of at least one of said gates.

21. The device of claim 19 or 20, comprising each said memory means comprising a plurality of memory blocks, and selecting means for selecting which of said blocks are to be addressed by said counting means to provide said timing signals.

22. The device of claim 1, 7, 2 or 4 comprising said memory means including plural memory blocks, each said memory block having said plurality of channels, and each said memory block having a respective set of said marks stored therein, and selecting means for selecting which of said memory blocks is being accessed by said count value to output the respective timing signals.

* * * * *

UNITED STATES PATENT AND TRADEMARK OFFICE
CERTIFICATE OF CORRECTION

PATENT NO. : 4,553,100
DATED : 12 Nov. 1985
INVENTOR(S) : Nishiura

It is certified that error appears in the above-identified patent and that said Letters Patent is hereby corrected as shown below:

On the cover page, Attorney, Agent, or Firm "halsey" should be --Halsey--.

Col. 1, line 53, "that" should be --than--.

Col. 4, line 33, "tne" should be --the--.

Col. 8, line 26, "$31_i$" should be --$31_1$--;

line 32, "CH1" should be --$CH_1$--.

Col. 19, line 15, "or" should be --of--.

Signed and Sealed this

Twenty-second Day of April 1986

[SEAL]

Attest:

DONALD J. QUIGG

Attesting Officer

Commissioner of Patents and Trademarks